US008215787B2

(12) United States Patent
Mathai et al.

(10) Patent No.: US 8,215,787 B2
(45) Date of Patent: Jul. 10, 2012

(54) ORGANIC LIGHT EMITTING DIODE PRODUCTS

(75) Inventors: Mathew K. Mathai, Gibsonia, PA (US); Mark L. Storch, Pittsburgh, PA (US); Glenn Thompson, Butler, PA (US); Eli J. Scott, Harwick, PA (US); Lisa Pattison, Morgantown, WV (US); Troy D. Hammond, Pittsburgh, PA (US)

(73) Assignee: Plextronics, Inc., Pittsburgh, PA (US)

( * ) Notice: Subject to any disclaimer, the term of this patent is extended or adjusted under 35 U.S.C. 154(b) by 287 days.

(21) Appl. No.: 12/543,442

(22) Filed: Aug. 18, 2009

(65) Prior Publication Data

US 2010/0046210 A1 Feb. 25, 2010

Related U.S. Application Data

(60) Provisional application No. 61/090,150, filed on Aug. 19, 2008, provisional application No. 61/102,330, filed on Oct. 2, 2008.

(51) Int. Cl.
*F21S 8/00* (2006.01)

(52) U.S. Cl. ........................................ 362/147; 362/330

(58) Field of Classification Search .......... 362/147–150, 362/249.02, 311.02, 367, 398, 404, 406, 362/601, 612, 800, 330
See application file for complete search history.

(56) References Cited

U.S. PATENT DOCUMENTS

| 4,538,214 A | 8/1985 | Fisher et al. |
| 4,920,467 A | 4/1990 | Honsberger et al. |
| 5,010,463 A | 4/1991 | Ross |
| 5,404,282 A | 4/1995 | Klinke et al. |
| 5,721,471 A | 2/1998 | Begemann et al. |
| 6,016,038 A | 1/2000 | Mueller et al. |
| 6,150,774 A | 11/2000 | Mueller et al. |
| 6,183,104 B1 | 2/2001 | Ferrara et al. |
| 6,234,645 B1 | 5/2001 | Borner et al. |
| 6,241,527 B1 | 6/2001 | Rast et al. |
| 6,255,786 B1 | 7/2001 | Yen |
| 6,441,558 B1 | 8/2002 | Muthu et al. |
| 6,515,314 B1 | 2/2003 | Duggal et al. |
| 6,565,231 B1 | 5/2003 | Cok |
| 6,608,453 B2 | 8/2003 | Morgan et al. |
| 6,661,029 B1 | 12/2003 | Duggal |
| 6,683,665 B1 | 1/2004 | Matthies |
| 6,697,262 B2 | 2/2004 | Adams et al. |
| 6,776,496 B2 | 8/2004 | Cok et al. |
| 6,777,891 B2 | 8/2004 | Lys et al. |

(Continued)

FOREIGN PATENT DOCUMENTS

CA 2549232 12/2006

(Continued)

OTHER PUBLICATIONS

U.S. Appl. No. 61/090,150, filed Aug. 19, 2008, Mathai et al.

(Continued)

*Primary Examiner* — Jason Moon Han
(74) *Attorney, Agent, or Firm* — Foley & Lardner LLP

(57) ABSTRACT

A plurality of organic light emitting diode (OLED) devices can be spatially distributed to form various lighting systems and luminaires. The lighting systems can be configured to readily replace conventional light bulbs or tubular fluorescent lamps. A networked lighting system including a plurality of OLED devices can have a variable light field based on a feedback.

15 Claims, 20 Drawing Sheets

U.S. PATENT DOCUMENTS

| | | | |
|---|---|---|---|
| 6,806,659 B1 | 10/2004 | Mueller et al. |
| 6,846,093 B2 | 1/2005 | Swaris et al. |
| 6,897,624 B2 | 5/2005 | Lys et al. |
| 7,012,585 B2 | 3/2006 | Agostinelli et al. |
| 7,014,336 B1 | 3/2006 | Ducharme et al. |
| 7,038,398 B1 | 5/2006 | Lys et al. |
| 7,064,498 B2 | 6/2006 | Dowling et al. |
| 7,108,392 B2 | 9/2006 | Strip et al. |
| 7,108,396 B2 | 9/2006 | Swaris et al. |
| 7,135,824 B2 | 11/2006 | Lys et al. |
| 7,145,125 B2 | 12/2006 | May et al. |
| 7,148,470 B2 | 12/2006 | Rains et al. |
| 7,157,694 B2 | 1/2007 | May et al. |
| 7,161,313 B2 | 1/2007 | Piepgras et al. |
| 7,175,296 B2 * | 2/2007 | Cok ............................. 362/147 |
| 7,178,941 B2 | 2/2007 | Roberge et al. |
| 7,186,003 B2 | 3/2007 | Dowling et al. |
| 7,204,622 B2 | 4/2007 | Dowling et al. |
| 7,207,693 B2 | 4/2007 | Ratcliffe et al. |
| 7,241,043 B1 | 7/2007 | Wu et al. |
| 7,255,624 B2 | 8/2007 | Daftari et al. |
| 7,259,391 B2 | 8/2007 | Liu et al. |
| 7,262,753 B2 | 8/2007 | Tanghe et al. |
| 7,303,305 B2 | 12/2007 | Kennedy |
| 7,306,353 B2 | 12/2007 | Popovich et al. |
| 7,329,027 B2 | 2/2008 | Phelan et al. |
| 7,334,917 B2 | 2/2008 | Laski |
| 7,348,738 B2 | 3/2008 | Foust et al. |
| 7,354,172 B2 | 4/2008 | Chemel et al. |
| 7,365,991 B2 | 4/2008 | Aldrich et al. |
| 7,374,311 B2 | 5/2008 | Rains et al. |
| 7,387,403 B2 | 6/2008 | Mighetto |
| 7,387,405 B2 | 6/2008 | Ducharme et al. |
| 7,387,406 B2 | 6/2008 | Swaris et al. |
| 7,806,569 B2 * | 10/2010 | Sanroma et al. ............. 362/398 |
| 2001/0000005 A1 | 3/2001 | Forrest et al. |
| 2002/0068191 A1 | 6/2002 | Kobayashi |
| 2003/0052616 A1 | 3/2003 | Antoniadis et al. |
| 2003/0067775 A1 | 4/2003 | Nagai et al. |
| 2003/0080678 A1 | 5/2003 | Kim et al. |
| 2004/0032205 A1 | 2/2004 | Hack et al. |
| 2004/0042199 A1 | 3/2004 | Cok |
| 2004/0132344 A1 | 7/2004 | Plishner |
| 2004/0178743 A1 | 9/2004 | Miller et al. |
| 2004/0195967 A1 | 10/2004 | Padiyath et al. |
| 2005/0012103 A1 | 1/2005 | Peng |
| 2005/0110384 A1 | 5/2005 | Peterson |
| 2005/0134525 A1 | 6/2005 | Tanghe et al. |
| 2005/0134526 A1 | 6/2005 | Willem et al. |
| 2005/0207165 A1 | 9/2005 | Shimizu et al. |
| 2005/0248935 A1 | 11/2005 | Strip et al. |
| 2006/0043912 A1 | 3/2006 | Foust et al. |
| 2006/0044215 A1 | 3/2006 | Brody et al. |
| 2006/0053527 A1 | 3/2006 | Schneider |
| 2006/0077669 A1 | 4/2006 | Thielemans et al. |
| 2006/0109219 A1 | 5/2006 | Robinson et al. |
| 2006/0126338 A1 | 6/2006 | Mighetto |
| 2006/0197456 A1 | 9/2006 | Cok |
| 2006/0232962 A1 | 10/2006 | Altman et al. |
| 2006/0245213 A1 | 11/2006 | Beil et al. |
| 2006/0262521 A1 * | 11/2006 | Piepgras et al. ............. 362/149 |
| 2006/0262544 A1 | 11/2006 | Piepgras et al. |
| 2006/0285361 A1 | 12/2006 | Cok |
| 2007/0064425 A1 | 3/2007 | Frecska et al. |
| 2007/0098334 A1 | 5/2007 | Chen |
| 2007/0125368 A1 | 6/2007 | Silverstein et al. |
| 2007/0178771 A1 | 8/2007 | Goetz et al. |
| 2007/0188427 A1 | 8/2007 | Lys et al. |
| 2007/0215870 A1 | 9/2007 | Nam |
| 2007/0263394 A1 | 11/2007 | Thielemans et al. |
| 2007/0273290 A1 | 11/2007 | Ashdown et al. |
| 2007/0274084 A1 | 11/2007 | Kan et al. |
| 2008/0002399 A1 | 1/2008 | Villard et al. |
| 2008/0080163 A1 | 4/2008 | Grote et al. |
| 2008/0087464 A1 | 4/2008 | Patterson et al. |
| 2008/0088648 A1 | 4/2008 | Nathan et al. |
| 2008/0237981 A1 | 10/2008 | Gilles et al. |
| 2009/0086478 A1 | 4/2009 | Sanroma et al. |

FOREIGN PATENT DOCUMENTS

| | | |
|---|---|---|
| CA | 2568430 | 10/2007 |
| CA | 2604364 | 3/2008 |
| DE | 8801246 | 3/1988 |
| DE | 202006006417 | 11/2006 |
| EP | 1391918 | 2/2004 |
| EP | 1408722 | 4/2004 |
| EP | 1457962 | 9/2004 |
| EP | 1367675 | 7/2006 |
| FR | 2836985 | 9/2003 |
| JP | 1222610 | 9/1989 |
| JP | 6-214509 | 8/1994 |
| JP | 2004363421 | 12/2004 |
| JP | 2006-278307 | 10/2006 |
| JP | 2007-172918 | 7/2007 |
| JP | 2008307084 | 12/2008 |
| TW | 256026 | 6/2006 |
| WO | WO 03/044297 | 5/2003 |
| WO | WO 2005/101513 | 10/2005 |
| WO | WO 2006/043943 | 4/2006 |
| WO | WO 2006/056066 | 6/2006 |
| WO | WO 2006/063212 | 6/2006 |
| WO | WO 2006/097763 | 9/2006 |
| WO | WO 2006/122392 | 11/2006 |
| WO | WO 2006/123335 | 11/2006 |
| WO | WO 2007/107916 | 9/2007 |
| WO | WO 2007/144365 | 12/2007 |
| WO | WO 2008/001274 | 1/2008 |
| WO | WO 2008/012702 | 1/2008 |
| WO | WO 2008/019487 | 2/2008 |
| WO | WO 2008/037450 | 4/2008 |
| WO | WO 2008/040323 A2 | 4/2008 |
| WO | WO 2008/063864 | 5/2008 |
| WO | WO 2008/068718 | 6/2008 |
| WO | WO 2008/071206 | 6/2008 |
| WO | WO 2008/099306 | 8/2008 |
| WO | WO 2008/157723 | 12/2008 |
| WO | WO 2009/115955 | 9/2009 |

OTHER PUBLICATIONS

U.S. Appl. No. 61/102,326, filed Oct. 2, 2008, Mathai et al.

Kraft, A. et al., "Electroluminescent Conjugated Polymers—Seeing Polymers in a New Light", *Angew. Chem. Int. Ed.*, vol. 37, pp. 402-428 (1998).

Li, Z. et al., "Organic Light-Emitting Materials and Devices", Optical Science and Engineering Series, CRC Taylor & Francis, (Table of Contents), 3 pages (Sep. 12, 2006).

Tang, C.W., et al., "Organic electroluminescent diodes", *Appl. Phys. Lett.*, vol. 51 No. 12, pp. 913-915 (1987).

IB of WIPO, International Preliminary Report on Patentability and Written Opinion, PCT/US2009/054224, May 17, 2010, 19 pages.

IB of WIPO, International Preliminary Report on Patentability and Written Opinion, PCT/US2009/054231, Apr. 23, 2010, 18 pages.

IB of WIPO, International Preliminary Report on Patentability and Written Opinion, PCT/US2009/054232, May 17, 2010, 19 pages.

IB of WIPO, International Preliminary Report on Patentability and Written Opinion, PCT/US2009/054228, Jun. 2, 2010, 21 pages.

* cited by examiner

ORGANIC LIGHT EMITTING DIODE PRODUCTS

CROSS-REFERENCE TO RELATED APPLICATIONS

This application claims priority to U.S. Provisional Patent Application Nos. 61/090,150, filed on Aug. 19, 2008, and 61/102,330, filed on Oct. 2, 2008, the complete disclosure of both applications being hereby incorporated by reference in their entirety.

BACKGROUND

Organic light emitting diodes (OLEDs) can utilize organic small molecules or polymers that produce light when transferred into their excited state by an external power source. Accordingly, OLED devices may be referred to as polymer light emitting diode (PLED) devices or small molecule organic light emitting diode (SMOLED) devices depending on their active compositions. Depending on the driven mechanisms of the OLEDs, sometimes the terminologies of active matrix OLED (AMOLED) and passive matrix OLED (PMOLED) are used.

Earlier OLEDs were typically based on relatively simple structures, where a thin layer of the electroluminescence (EL) conjugated polymer was enclosed between a pair of electrodes. When a voltage is applied to the electrodes, the positive (anode) and the negative (cathode) electrodes can provide injection of holes and electrons, respectively, into the EL polymer. In the EL polymer layer, electrons and holes move towards each other in the applied electrical field and form excitons, which are bound excited states that can relax down into the ground state radiatively by emitting a photon. This process can be referred to as electroluminescence. OLED devices are of interest in, for example, display, signage, and lighting.

OLEDs were first designed in the 1980s, see, e.g., C. W. Tang, S. A. Van Slyke, Organic electroluminescent diodes, Appl. Phys. Lett. 1987, 51, 913. More recent developments in OLED materials and applications are generally described in Kraft et al., Angew. Chem. Int. Ed., 1998, 37, 402-428, and Z., Li and H. Meng, Organic Light-Emitting Materials and Devices (Optical Science and Engineering Series), CRC Taylor & Francis (Sep. 12, 2006). The disclosures of these references are incorporated by reference in their entirety.

SUMMARY

Described herein are embodiments which include, among other things, devices, articles, instruments, apparatuses, kits, systems, and the like, and methods of making and methods of using same. More specifically, the various embodiments described in this application can generally relate to lighting systems comprising organic light emitting diode (OLED) devices. In particular, the embodiments are related to configurable lighting systems.

In one aspect, a lighting system is provided including a mount and a plurality of OLED devices disposed on the mount. The mount can be configured to be removably coupled to a receptor.

In another aspect, a lighting system is provided including a plurality of OLED devices, wherein the plurality of OLED devices are arranged in a spatial distribution such that a light output from the lighting system is concentrated in a predetermined region.

In another aspect, a lighting system is provided including a plurality of OLED devices, wherein the plurality of OLED devices form visually-discernible patterns.

In another aspect, a lighting system is provided including a mount, a plurality of OLED devices disposed on the mount, and an arm coupled to the mount.

In another aspect, a lighting system is provided for an imaging application, including a flexible mount and a plurality of OLED devices disposed on the flexible mount.

In another aspect, a lighting system is provided including a plurality of OLED devices, wherein the plurality of OLED devices are configured to be selectively activated based on an input, and wherein the input comprises one or more of an ambient light, a person's position, an ambient temperature, a user input, season, or time.

In another aspect, a method is provided including arranging a plurality of OLED devices in a spatial distribution, and selectively activating the plurality of OLED devices to different activation levels based on an input to generate a variable light field, wherein the input comprises one or more of an ambient light, a person's position, an ambient temperature, a user input, season, or time.

In another aspect, a lighting system is provided including a plurality of OLED devices and a mount. The mount has a frame configured to receive at least one of the plurality of OLED devices. The frame provides an electrical connection between the mount and at least one of the plurality of OLED devices.

At least one advantage from at least one embodiment is that the OLED lighting system can be used with existing lighting fixtures. The OLED light systems can be readily plugged in existing receptors for conventional light bulbs or tubular fluorescent lamps.

At least another advantage from at least one embodiment is that the light field is controllable in its brightness and color characteristics.

DETAILED DESCRIPTION

Introduction

All references cited in this application are hereby incorporated by reference in their entirety. In particular, the disclosures of U.S. Provisional Patent Application No. 61/090,150, filed on Aug. 19, 2008, and U.S. Provisional Patent Application No. 61/102,326, filed on Oct. 2, 2008, are hereby incorporated by reference in their entirety.

The use of organic materials in electroluminescent devices offers several desirable properties, for example, increased luminescence of the device; lower threshold voltage; ease of processability of materials and components during device fabrication; the ability to use spin casting, drop casting, and printing techniques to apply different layers in electroluminescent devices; the ability to prepare flexible electroluminescent devices; the ability to prepare low-weight electroluminescent devices; and the ability to prepare low-cost electroluminescent devices.

An electroluminescent device generally can be a device that converts electrical current to electromagnetic radiation. In particular, OLEDs provide an efficient way to produce light at low voltage and minimal radiant heat. These devices currently find uses in many consumer electronics such as displays, signage, and lighting. OLEDs are generally known in the art as described in, for example, *Organic Light-Emitting Materials and Devices*, edited by Li and Meng, 2007.

Lighting System

Figure 1A:
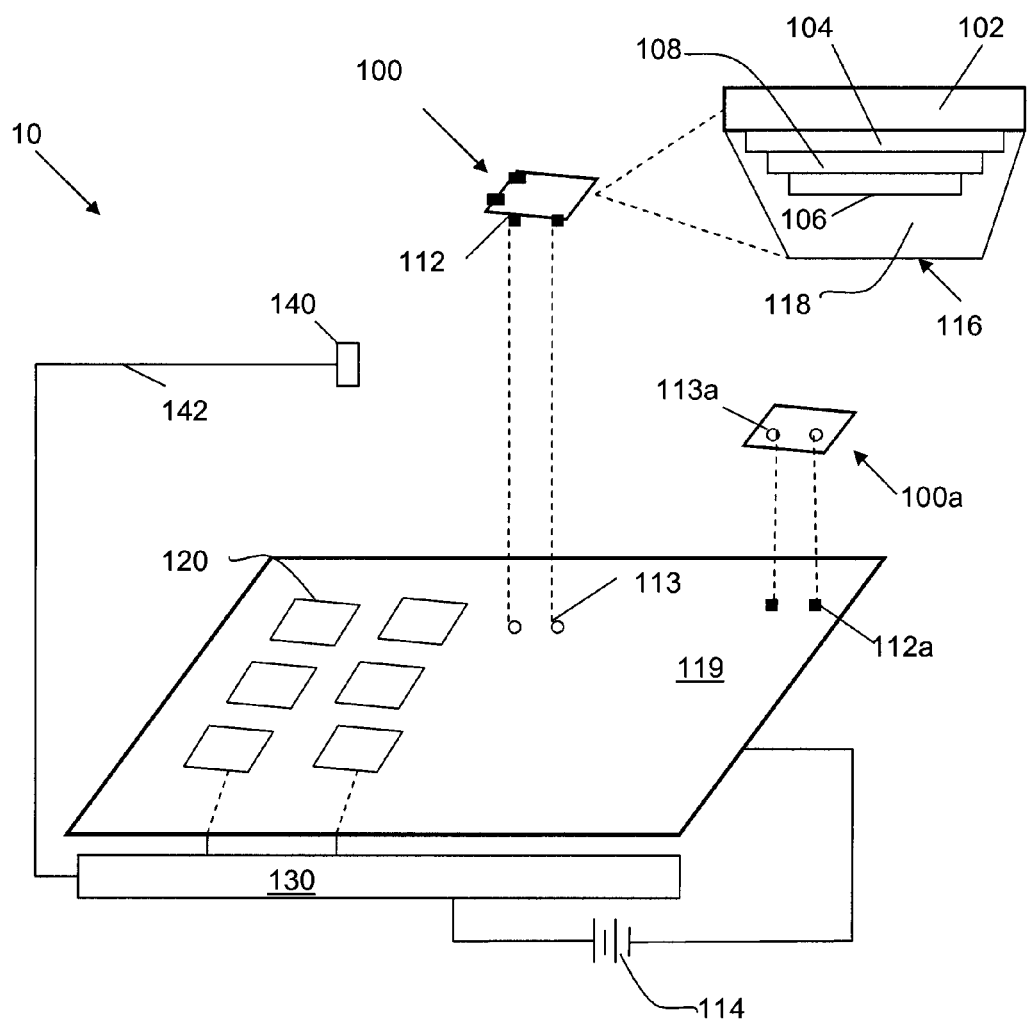
FIG. 1A is a perspective view of an example OLED device implemented in an example lighting system.

An example lighting system 10 is illustrated in FIG. 1A. The lighting system 10 comprises a plurality of OLED devices 100. The plurality of OLED devices is selected such that the lighting system 10 emits light with a predetermined color characteristic. A color characteristic may be a correlated color temperature or a color rendering index, for instance. For example, by selectively mixing OLED devices of different colors, the light output from the light emitting lighting system 10 can be substantially white. In addition, the light output from the lighting system 10 can be tunable based on user preferences. Thus, the lighting system 10 is a configurable system.

In one embodiment, at least some of the OLED devices emit light of different colors, and wherein the colors are selected from, for example, red, green, blue, white, and the like. In this application, the phrase "at least some" of the OLED devices refers to two or more OLED devices. At least some of the OLED devices are removable, and the system is also expandable to have more OLED devices "plugged in." Thus, the color of the output light from the lighting system, which is a mix of those of individual OLED devices, is changeable by selectively replacing at least a subset of OLED devices.

OLED Devices

An example OLED device 100 is illustrated in FIG. 1A as part of a lighting system 10. The OLED device 100 can comprise a substrate 102, an anode 104, a cathode 106, and an active region 108. Alternative to the structure shown in FIG. 1A, an inverted OLED structure of substrate/cathode/active region/anode can be used.

The active region 108 comprises an organic material, and is electrically coupled to the anode 104 and the cathode 106. The active region 108 is configured to emit a broadband emission spectrum with a full width at half maximum (FWHM) larger than about 50 nm.

The OLED device 100 can have a plurality of couplers 112 configured to couple the OLED device 100 to a mount 119 through indentations 113. The couplers 112 can be mechanical couplers, or can be used to electrically couple at least one of the anode 104 or the cathode 106 to a power supply 114. In one embodiment, the couplers 112 are used for both electrical coupling and mechanical coupling.

In some embodiments, OLED device 100a can be provided having one or more indentations 113a, and the mount 119 can have attached couplers 112a configured to couple the OLED device 100a to the mount 119. As described further below, in some other embodiments, standalone couplers can be provided to couple the OLED devices with a mount or with each other.

The OLED device 100 also can have an encapsulation 116 that isolates the active region 108 from an ambient environment. In particular, the encapsulation 116 prevents water vapor and oxygen from entering the enclosure 118 to interact with the organic material in the active region 108. The encapsulation may also serve to physically protect the active region. With the couplers 112 and the encapsulation 116, the OLED device 100 may be readily used as a standalone device, or may be dropped in a lighting system to replace another device.

The couplers 112 may be configured to electrically couple at least one of the anode 104 or the cathode 106 with the power supply 114 via a mount 119. The mount 119 is sometimes referred to as the "system substrate," which provides a frame onto which the lighting system can be built. In addition to mechanical support, the mount 119 can also provide electrical paths for the OLED devices. The mount 119 may be flat or curved. The mount 119 can be flexible, and the resulting lighting system can be flexible in shape. The mount 119 may comprise one or more rails to which OLED devices are slidably coupled.

Some of the couplers 112 may be configured to electrically couple at least one of the anode 104 or the cathode 106 with the power supply 114 via a second OLED device 120. By selecting a plurality of OLED devices, a lighting system may be assembled with a desired color, pattern, area, and brightness.

In addition to the electrical coupling, the couplers 112 may also mechanically couple the OLED device with the mount 119 or with the second OLED device 120.

The mount may be configured to be free-standing, or mounted to a surface, for example a wall or a ceiling. Since OLEDs are Lambertian emitters, the mount need not be designed to mix the light of OLEDs of various emission spectra.

Substrate

Substrates are generally known in the art. Descriptions of various substrates may be found in, for example, Z., Li and H. Meng, Organic Light-Emitting Materials and Devices (Optical Science and Engineering Series). The substrate 102 of the OLED device 100 can be, for example, a solid substrate or a flexible substrate. The substrate can comprise, for example, an inorganic material or an organic material. The substrate can be, for example, made from glass, metal foil, or plastic. The substrate can be, for example, flats, or can have a curvature in one or more dimensions. The substrate can be, for example, rigid, flexible or conformable. The substrate can be, for example, transparent, semi-transparent, translucent, or opaque.

Anode

Anodes are generally known in the art. The anode 104 of the OLED device 100 can be transparent to the light emitted from the OLED device 100. The anode 104 may comprise, for example, a transparent conductive oxide (TCO). Examples of TCOs include indium tin oxide (ITO), ZnO, and the like. ITO in the form of thin layers (e.g., about 100 nm thick) is substantially transparent to visible light. Substantially transparent layers desirably allow a visible light transmission of about 70% or more. ITO has a relatively high work function that helps the injection of holes into the active region 108. The ITO may be coated on a glass or plastic substrate.

In some other embodiments, anodes can be thin and somewhat transparent, or comprise thick and highly reflective metal.

Cathode

Cathodes are generally known in the art. The cathode 106 of the OLED device 100 can also be transparent. The cathode 106 may comprise, for example, a thin metal film such as aluminum or calcium, or a non-metal conductive layer. The cathode 106 typically has a relatively low work function to help injecting electrons into the active region 108. The cathode 106 can be at least 100-200 nm thick.

Active Region

The active region refers generally to the region where electrons and holes recombine to radiate photons. In the claimed embodiments, the active region comprises an organic material, and the radiative photon energy may correspond to the energy difference between the lowest unoccupied molecular orbital (LUMO) level and the highest occupied molecular orbital (HOMO) level of the organic material. Photons of lower energy/longer wavelength may be generated by higher-energy photons through fluorescent or phosphorescent processes.

The active region can comprise multiple layers, for example, a combination of p- and n-type layers. The p- and n-type materials may be bonded to each other. The bonding can be ionic or covalent bonding. The multiple layers of the active region may form heterostructures therebetween.

The active region may be manufactured by known methods including, for example, spin coating, drop casting, slot die coating, vapor deposition or sputtering, crystalline growth, patterned etching, dip coating, or by printing techniques such as ink jet printing, off-setting, transfer processes, or by spray applications.

Organic Material

The organic material in the active region 108 may include an electroluminescent polymer. The polymer may be a fluorescent emitter, or a phosphorescent emitter or a combination of fluorescent and phosphorescent emitters. The polymer may include, for example, poly-phenylene vinylene, or polyfluorene. The polymers are often engineered to substitute side chains onto the backbone to tune the color or to improve the processing of the polymers.

Alternative to a polymer emitter, a small molecule emitter comprising for example, organo-metallic chelates or conjugated dendrimers, may be used.

The organic material may be doped with phosphorescent material.

Electrical Coupling

The electrical coupling between the active region 108 and the anode 104 or cathode 106 may be a direct-contact coupling, or through more layers as discussed in detail below.

Power Supply

The power supply 114 may comprise a battery, an adapter, or may be part of a power grid. The OLED devices may be powered by AC or DC current.

Feedback

An input may be provided for a controller 130 to control the lighting system 10 or the OLED devices 120. The input may be provided by a feedback mechanism, and the feedback mechanism may include, for example, a sensor 140 for sensing a luminance of one or more of the OLED devices. The output from the sensor 140 is then fed back to the controller 130. Based on the feedback, the controller 130 may control the drive current or drive voltage of individual OLED devices or the lighting system 10 to adjust a color or a luminance of light emission, or some other characteristic of the output light. Although a feedback data line 142 in the form of a wire is shown to transmit feedback data from the sensor 140 to the controller 130, those of ordinary skill in the art will recognize that wireless transmission may be used.

In addition to the remote sensor 140 shown in FIG. 1, one or more sensors may be located adjacent to individual OLED devices to measure, for example, a measured current, a capacitance, or a junction temperature. These parameters can also be fed back to the controller 130 to control the lighting system 10.

Controller

The lighting system 10 may comprise the controller 130. The controller 130 may include a processor and memory. Each of the individual OLED devices may be assigned a logical address, and the control circuit individually controls the OLED devices based on their logical addresses. The controller 130 may individually address and control the OLED devices to adjust the color, pattern, brightness, or to compensate for aging.

Instead of changing the output color of the lighting system 10 by selectively coupling different OLED devices 120 onto the mount 119 as discussed above, a color of the emitted light from the lighting system can also be tunable by selectively driving at least some of the plurality of OLED devices differently from other OLED devices.

Selectively driving some of the plurality of OLED devices differently from other OLED devices may be realized by, for example, selectively varying a drive voltage or a drive current of the OLED devices.

Figure 1B:
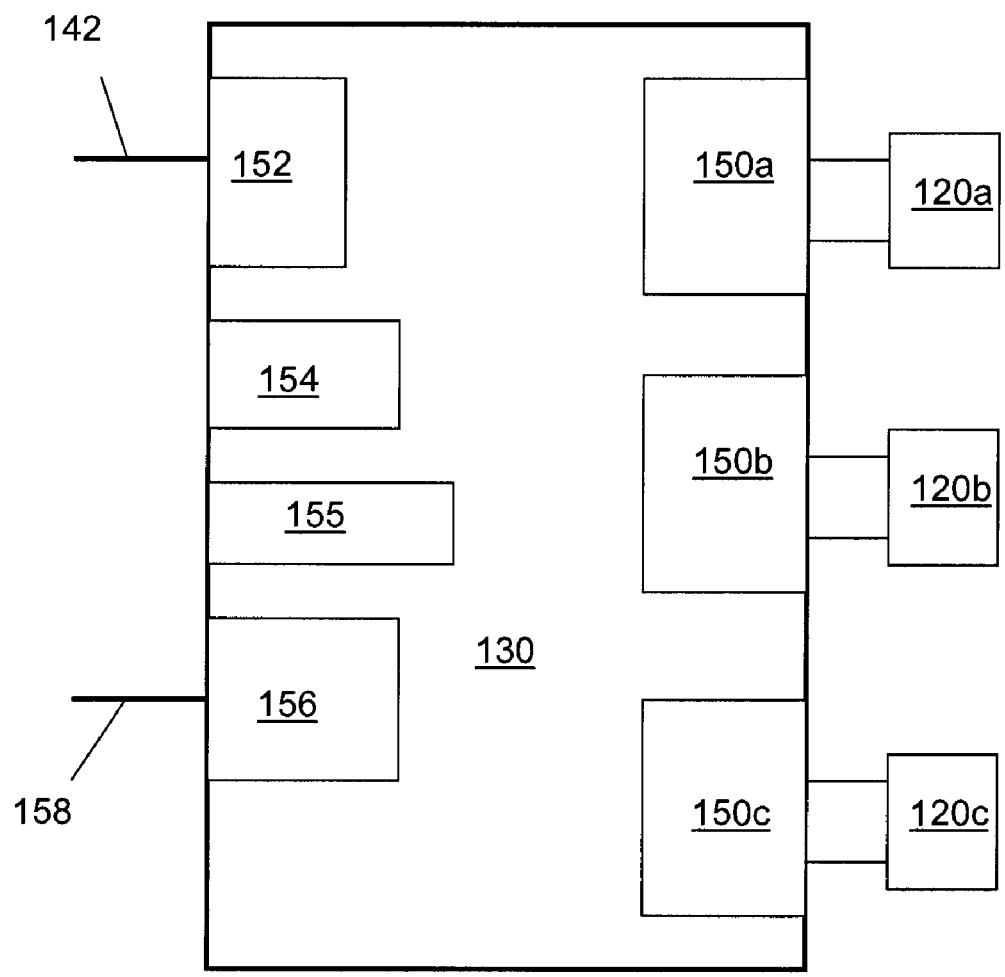
FIG. 1B is a block diagram of an example controller for controlling the lighting system.

A simplified block diagram of a controller 130 according to one embodiment is shown in FIG. 1B. As shown, the plurality of OLED devices 120a, 120b, 120c can be controlled by the controller 130 through digital-to-analog converters (DAC) 150a, 150b, 150c, respectively. The OLED devices 120a, 120b, 120c can have different colors, such as red, green, and blue, respectively. The DAC 150a, 150b, 150c can deliver drive current pulses of suitable amplitudes and widths to their respective OLED devices 120a, 120b, 120c. The OLED devices 120a, 120b, 120c can be driven independently, collectively, or interdependently.

The controller 130 can further comprise an input/output (I/O) interface 152 to receive the feedback data from the sensor 140 through the feedback data line 142. Memory 154 can be included in the controller 130 to store commands to generate drive sequences. A clock 155 can be used to synchronize the drive sequences. The controller 130 can further comprise a data port 156 to receive command data from data line 158, and the command data can come from a user, a processor, or a computer. The controller 130 can further comprise other components generally known in the art, such as shift registers.

The controller 130 can be implemented using, for example, a computer with suitable control software and additional discrete components, or using an application specific integrated circuit (ASIC).

Coupler

The OLED device in accordance with the claimed embodiments may comprise a coupler for coupling the OLED device with a mount or with one or more other OLED devices. The resulting OLED device is pre-manufactured in a modular fashion such that the OLED device may be a "plug-and-play" device. The OLED device can be readily "plugged in" to a system to reconfigure the color, appearance, brightness, or other properties of the system, or replace an existing OLED device in the system. The coupler can provide mechanical or electrical coupling. In addition, the coupler can provide a combination of mechanical and electrical coupling.

In the embodiment shown in FIG. 1, the couplers 112 include those for coupling the OLED device 100 onto a mount 119, and those that can be configured to couple to one or more other OLED devices.

Figure 2A:
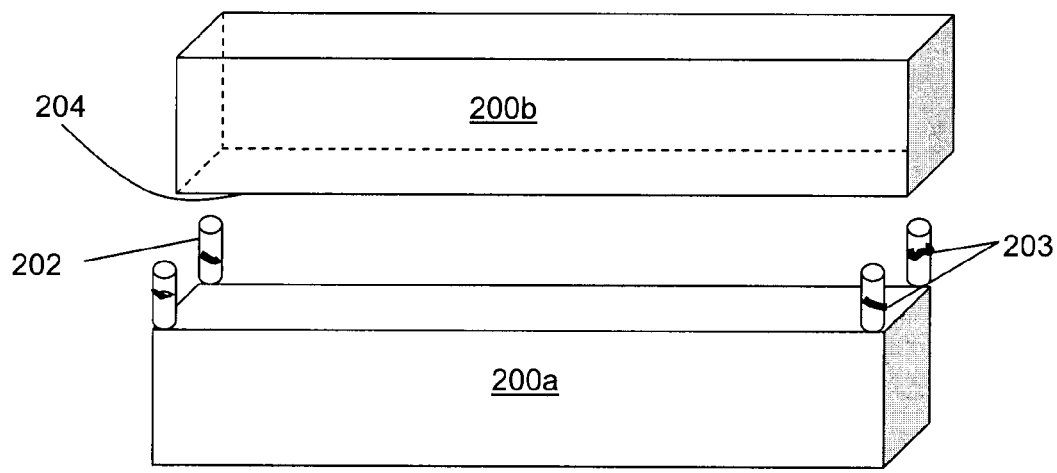
FIGS. 2A-2D are perspective views of example OLED device couplers.

In one embodiment as illustrated in FIG. 2A, a coupler 200a may comprise a plurality of protrusions 202 configured to couple to a complementary opening or indentation 204 in a corresponding coupler 200b. The lateral dimension of the opening 204 substantially matches the spacing of the protrusions 202. The indentations may be holes or slots in the OLED device. The protrusions 202, or the coupler 200b, or both, may be slightly flexible. This can be achieved, for example, by making the couplers 200a and 200b using plastics. By plugging the protrusions 202 into the opening 204, a removable yet stable, coupling can be realized. The interlocking mechanism resembles that of the LEGO™ building blocks. The corresponding coupler 200b may be part of the mount, or part of a second OLED device. The protrusions 202 may have conductive and/or insulating patterns 203 disposed thereon, which may be electrically coupled to corresponding conductive regions (not shown) in the opening 204 to make electrical connections when the couplers 200a, 200b are joined together. These conductive regions may be electrically connected to at least one of the anode or cathode or a power supply. The conductive regions of the couplers may be configured to provide an electrical connection between the OLED device electrodes and a power supply when corresponding couplers are joined.

Figure 2B:
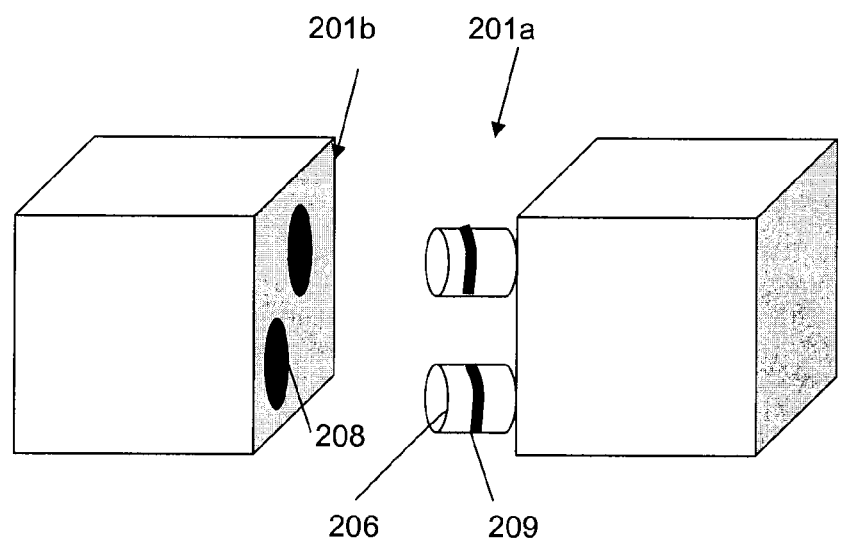

In one embodiment as illustrated in FIG. 2B, a coupler 201a may comprise one or more protrusions 206 configured to be coupled into corresponding indentations 208 in a corresponding coupler 201b. The protrusions 206 may have conductive patterns 209 disposed thereon, which may be electrically coupled to corresponding conductive regions (not shown) in the indentations 208 to make electrical connections when the couplers 201a, 201b are joined together. Thus, in addition to making the mechanical coupling, the couplers also function as electrical coupling.

Figure 2C:
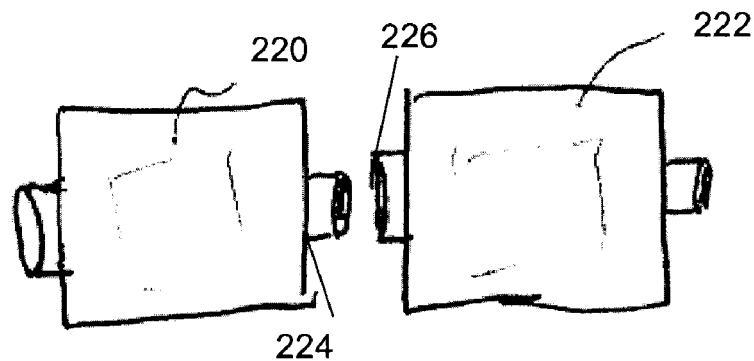

In one embodiment as illustrated in FIG. 2C, a plurality of substantially identical OLED devices 220, 222 can be matingly coupled using matching couplers 224, 226. For example, the outer diameter of the coupler 224 may be substantially the same as the inner aperture of the coupler 226, such that the coupler 224 may be snugly fit into the coupler 226. A large number of OLED devices can thus be coupled, mechanically and/or electrically, to form a lighting system.

Figure 2D:
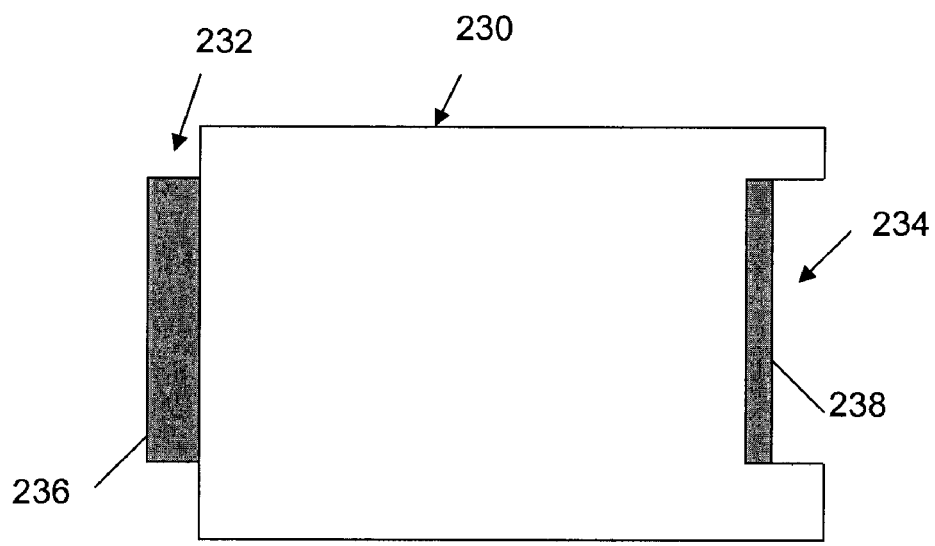

In another embodiment as illustrated in FIG. 2D, an OLED device 230 has protrusion portion 232 and indentation portion 234 fitted with metal inserts 236, 238, respectively. The metal inserts 236, 238 can be coupled to the electrodes of the OLED device 230. Identical OLED devices can thus be matingly coupled to each other while the metal inserts 236, 238 form electrical connections. The metal inserts 236, 238 can be spring loaded to facilitate the mechanical coupling.

In the embodiments shown in FIGS. 1-2D, the couplers are attached to, or are part of, the OLED devices. As discussed below, in some other embodiments, couplers may be provided separately from the OLED devices and may be provided as part of a kit for assembling OLED devices into a lighting system.

Encapsulation

The OLED device may be already packaged in an encapsulation that protects the organic material of the OLED device from the ambient environment. The resulting OLED device may thus be a standalone device that can be readily installed in a system which does not necessarily provide oxygen and water vapor barriers.

Encapsulation may comprise barrier layers such as single or multi-layer barrier films such as Barix. Methods of coverage may include lamination, vapor deposition, or solution deposition. Furthermore, the encapsulation may comprise a sealant and a barrier structure such as a barrier film or housing. Desiccant materials may be contained within the encapsulation.

Figure 3:
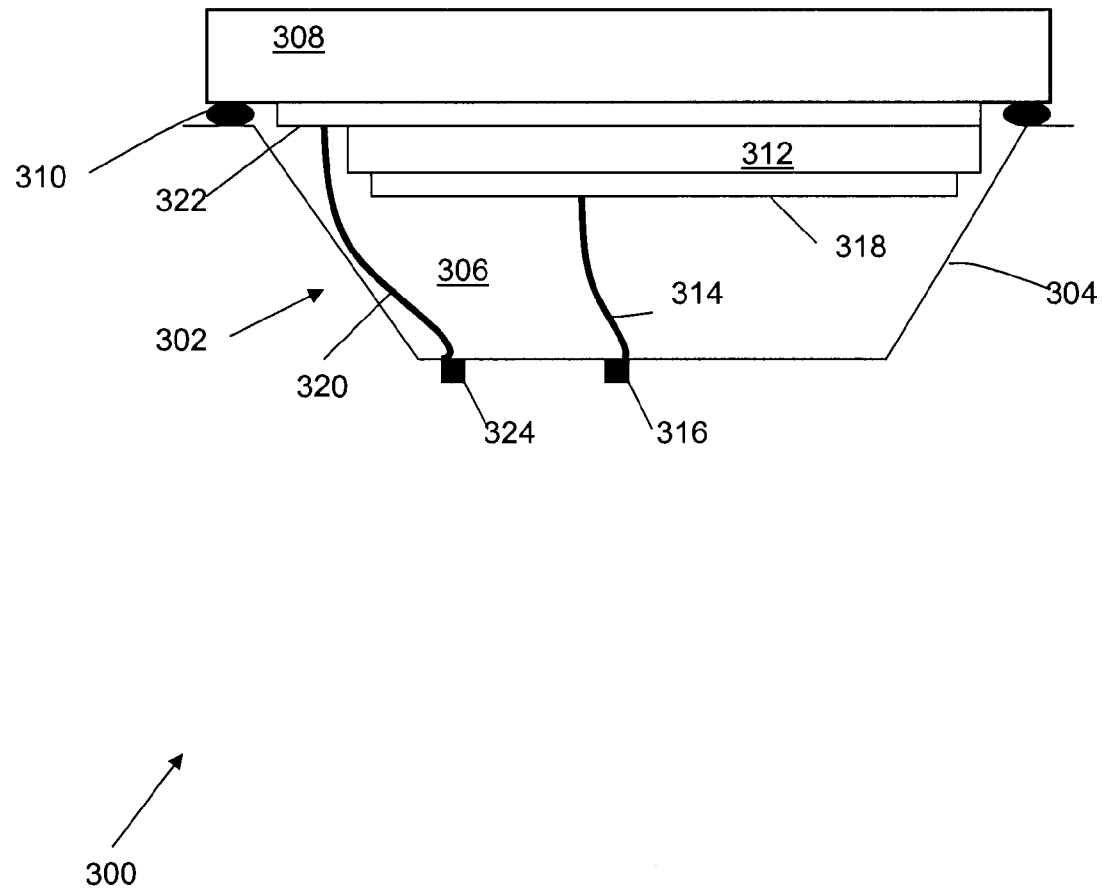
FIG. 3 is a cross-sectional view of an example OLED device packaged in an encapsulation.

An encapsulation 302 of an OLED device 300 is illustrated in FIG. 3. The encapsulation 302 comprises a housing 304 forming an enclosure 306 with the substrate 308. A first sealant 310 is disposed between the housing 304 and the substrate 308, and forms an oxygen and water vapor barrier for the active region 312. The first sealant can be conductive and may comprise, for example, Mylar™ coated with metal.

The housing may have a first electrically conductive path 314 disposed in a first hermetic seal 316 through the housing 304. The first electrically conductive path 314 may be electrically coupled to the cathode 318.

The housing 304 may further have a second electrically conductive path 320 through the housing 304 via a second hermetic seal 324. The second electrically conductive path 320 may be electrically coupled to the anode 322. In this case, the housing 304 may comprise a non-conductive material.

In another embodiment, the housing 304 may be electrically conductive. For example, the housing 304 may comprise a metal, such as aluminum, or a conductive plastic. In this case, the first electrically conductive path 314 is electrically isolated from the housing 304. Instead of using the second electrically conductive path 320 through the housing 304, the anode 322 may be electrically coupled to the housing 304 through the first sealant 310 which in this case is conductive.

The electrically conductive housing 304 may thus form a common anode with neighboring OLED devices.

Housing

Figure 4:
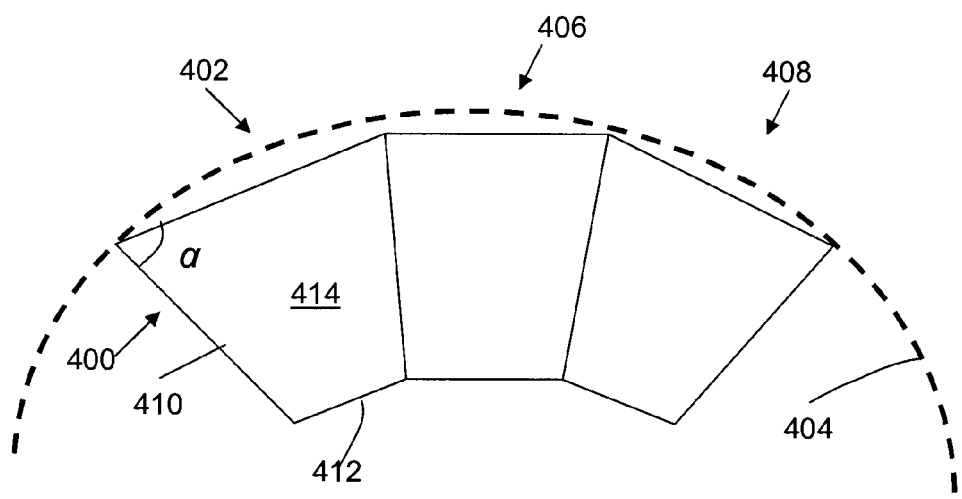
FIG. 4 is a cross-sectional view of a plurality of packaged OLED devices tightly arranged on a curved surface.

As shown in FIG. 4, the housing 400 has a contoured shape that allows the OLED device 402 to be arranged on a curved surface 404 with a plurality of neighboring OLED devices 406, 408 without causing substantial interference between housings of neighboring OLED devices.

In one embodiment, the housing 400 has a slanted side wall 410 and a bottom wall 412, wherein a slant angle α of the slanted side wall 410 is selected such that, when the OLED device 402 is tightly arranged with a plurality of neighboring OLED devices 406, 408 on the curved surface 404, housings of neighboring OLED devices do not substantially interfere with each other. For example, when the slant angle α is about 60°, two neighboring OLED devices 402, 406 may be arranged on a curved surface with such a curvature that the OLED devices 402, 406 form an inward angle of about 120°, while the neighboring sidewalls do not exert pressure on each other. In some embodiments, the slant angle α is in the range between about 30° and 90°. Accordingly, the individual devices 402, 406, 408 can be substantially flat and rigid, while mosaics of such devices can cover curved surfaces of different curvatures.

The enclosure 414 formed between the housing 400 and the substrate may be filled with an inert gas, such as argon, at a pressure equal to or higher than an atmospheric pressure. This further helps prevent oxygen and water vapor from entering the enclosure 414. For example, the pressure may be between about 1.05 and 1.5 times the atmospheric pressure. The strength of the housing material and the active region material determines how high the pressure can be. In one embodiment, the pressure is about 1.1 times the atmospheric pressure.

In the top plan view, the housing 400 has a shape configured to improve the fill factor, i.e., the ratio between the light emitting area to the total area, of the OLED device. The shape of the housing 400 in the top plan view may be a circle, an oval, or polygonal. The housing 400 may be coated with a color or labeled with a symbol indicative of a light emission color of the active region, for example, red, green, blue, or white.

In some embodiments, the housing may comprise transparent plastic to allow light to pass therethrough. The housing may also be made of glass. The glass housing may be manufactured in a certain shape to improve light out coupling.

Polygonal OLED Devices

Figure 5:
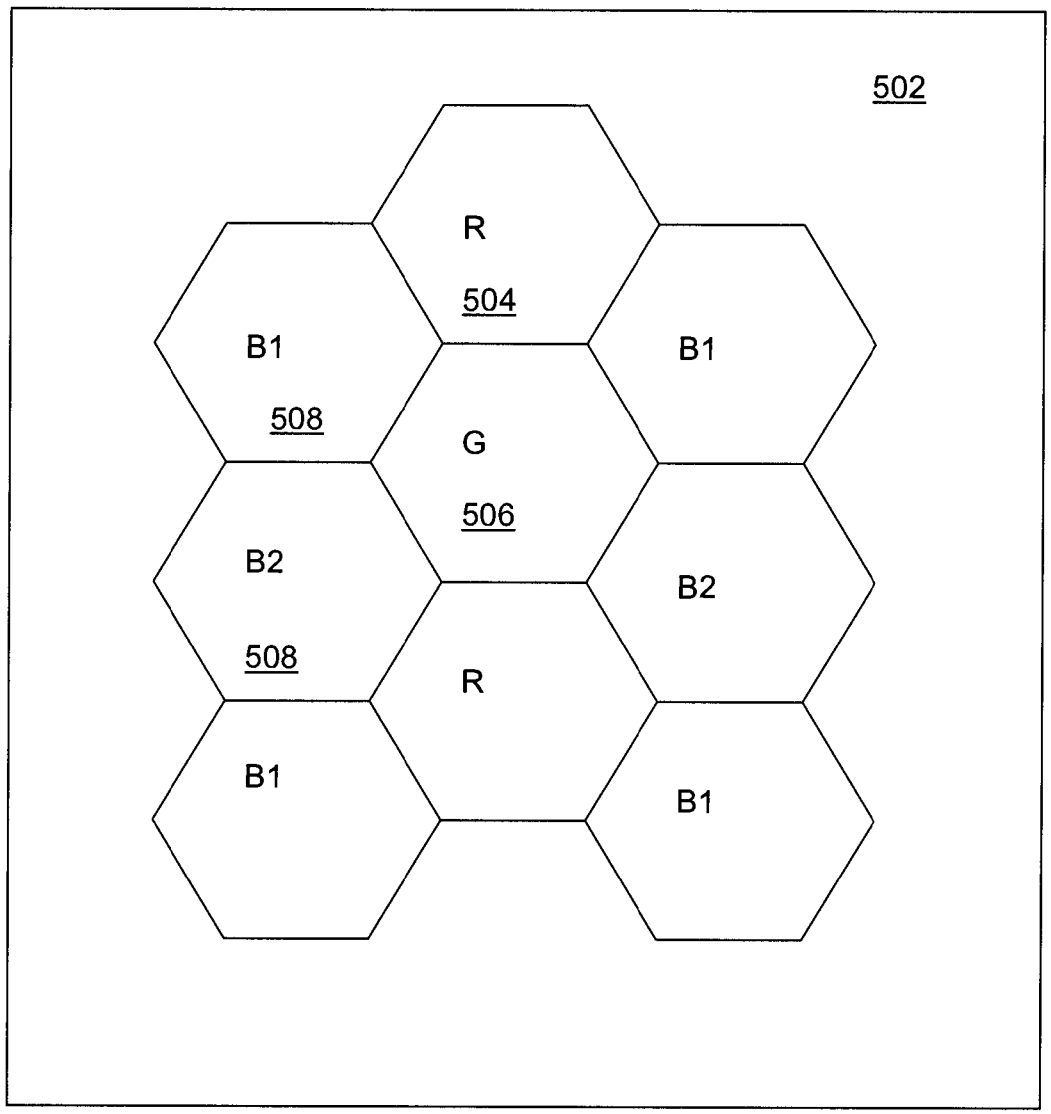
FIG. 5 is a top plan view of a plurality hexagonal OLED devices tightly arranged into a matrix.

In one exemplary embodiment, the housing may have a substantially polygonal shape, such as the hexagonal shape in the top plan view as shown in FIG. 5. Thus, the OLED device 506 is configured to be neighboring six other polygonal OLED devices to form a tightly arranged mosaic.

A plurality of OLED devices, which are pre-manufactured and can be already packaged, are "plugged in" to a mount 502 and arranged in the pattern. The mount 502, which may have a curved surface similar to that illustrated in FIG. 4, has a plurality of indentations to receive the OLED devices. The housings of the OLED devices can serve as mechanical couplers to be coupled to the mount 502 at the indentations, while electrical contacts can be made adjacent the hermetic seals. In the case that the housing is electrically conductive as discussed above with reference to FIG. 3, the housings also serve as electrical couplers.

In the embodiment shown in FIG. 5, the modular OLED devices have hexagonal shapes to improve the density or fill factor of the lighting system. Those of ordinary skill in the art will recognize that other shapes can also be used. For example, by appropriately selecting and patterning the modular OLED devices of different shapes (e.g., pentagons, hexagons, triangles) and sizes, a lighting system of complex 3-dimensional shapes, such as that of a geodesic dome, may be achieved.

Color Tuning

Advantageously as a result of the modular design discussed in this application, the individual OLED devices may be selected from a kit comprising devices with different color characteristics, sizes, and shapes.

At least one of the OLED devices is removably coupled to the mount 502, and the system is expandable to include more OLED devices. Accordingly, a mixed color of the emitted light from the lighting system is adjustable by selectively replacing at least a subset of OLED devices. For example, by replacing some of the blue OLED devices with red OLED devices, the color of the output light from the lighting system can be shifted toward a warmer color.

Alternatively, the individual OLED devices may be individually addressed and controlled using, for example, the controller 130 shown in FIG. 1. The color of the emitted light from the lighting system is tunable by selectively driving at least some of the plurality of OLED devices differently from other OLED devices. Driving the OLED devices differently may be realized by driving the OLED devices to different activation levels. Such activation levels may include, for example, voltage levels, current levels, on/off states, and pulse widths.

For example, a drive voltage or a drive current of some of the plurality of OLED devices may be selectively varied. By increasing the drive voltage or the drive current of the blue OLEDs, the overall output color of the lighting system is tuned toward a cooler color temperature.

In another example, some of the OLED devices may be selectively turned on or off to adjust the output color and luminosity.

In yet another example, the OLED devices are driven in a pulse width modulation (PWM) method, where the activation levels of the OLED devices are determined by a drive pulse width. By selectively increasing the pulse width of, for example, some of the blue OLED devices, the output color of the lighting system is tuned toward a cooler color temperature.

OLED Device Wearing

In order to drive an OLED device to emit light, an electrical current is passed through an active region or a light emitting layer of the device. One cause of "aging" or "wearing" of the device occurs when molecular bonds within the material making up the active region are broken or formed when photons, excitons, electrons and/or holes chemically interact with the material. The presence of oxidants or reductants may facilitate such aging or wearing. OLED devices that emit different colors, for example, have different wearing and aging characteristics or profiles. Blue OLEDs are generally known to age more quickly than red OLEDs, causing blue OLEDs to fail in a shorter period of time than red OLEDs under similar operating conditions.

Wear leveling refers to various approaches that can be undertaken to improve the overall aging profile of a collection of OLED devices even when the individual OLED devices within the collection have different aging profiles. A wearing level of an OLED device may be determined based on, for example, an accumulative duration that the OLED device has been previously activated. The prior activation history of the OLED device may be recorded in a memory device. The history may include, for example, drive voltage or current pulse width, frequency, amplitude, and accumulative duration.

In addition, the wearing level of the OLED device may be characterized by a measured current, a capacitance, a junction temperature, or a luminance of the OLED device. The current or the capacitance may be measured using the controller in conjunction with appropriate electrical circuitry. The parameters such as the junction temperature may be measured locally using a temperature sensor adjacent to, or embedded in, the active region. The luminance may be measured by an optical detector at a distance from the OLED device.

Expected Lifetime

When an OLED device has degraded to a predetermined level such that the OLED device emits light below a predetermined efficiency threshold, the OLED device is said to have reached its expected lifetime. Different types of OLED devices have expected lifetime of different lengths. For example, blue OLEDs typically have shorter lifetime because of the higher photon energy. The expected lifetime of conventional blue OLEDs is typically only about half that of red OLEDs or green OLEDs of the same size when operated at conditions such that a mixed light output has desired characteristics, e.g., at certain color coordinates in color space.

When a certain number of OLED devices reach their lifetime, the collection of OLED devices in the lighting system starts to have a significantly degraded performance, and the lighting system is said to have reached its own lifetime. In conventional lighting systems, the lifetimes of different types of OLED devices are not matched. For example, when blue OLED devices have reached their lifetime, OLED devices of other colors would be still usable. However, the color coordinates of the lighting system would have changed and reached its lifetime due to the degradation of the blue OLED devices.

As discussed below, lighting systems are provided with matching lifetimes of different types of OLED devices. In a "low cost" approach, the degraded OLED devices may be simply replaced, taking advantage of the modular design of the OLED devices and their couplings to the mount. In another approach, pre-installed redundant OLED devices in the lighting system can be activated to replace or augment the degraded devices. In yet another approach, the different types of OLED devices are provided with different sizes and/or different drive currents, thereby substantially matching their lifetimes and effectively expanding the lifetime of the lighting system.

Configurable Lighting System with Improved Lifetime

In a lighting system, the plurality of OLED devices may include a first number of a first type of OLED devices and a second number of a second type of OLED devices. The first type of OLED devices have a spectrum (e.g., color) different from a spectrum of the second type of OLED devices. An individual OLED device may have its lifetime correlated to its emission spectrum. Typically an OLED of shorter emission wavelength has a shorter lifetime, as discussed above with respect to blue OLED devices. This may result from the fact that the photons of shorter wavelength are more energetic so that they break the bonds in the molecules of the active region faster than do the photons of longer wavelengths.

Accordingly, the numbers of different types of OLED devices may be selected to be inversely proportional to their expected lifetime. In one embodiment, the numbers of different types of OLED devices are selected based on their expected lifetime. For example, a two-to-one ratio between the number of blue OLEDs and the number of red OLEDs may be predetermined. This ratio is based on the expected average lifetime of the blue OLED being only half that of the red OLED or green OLED. Accordingly, in the system shown in FIG. 5A, for every red OLED device 504 or green OLED device 506, two blue OLED devices 508 are included.

In one embodiment, all the OLEDs may be simply driven by a common voltage and the blue OLEDs may be configured to have a higher resistance and thus a lower current. During the wearing/aging of the lighting system, the color and other optical characteristics such as the brightness are thus effectively controlled by the pre-selected numbers of different OLED devices. For example, the color coordinates of the light output from the lighting system can be maintained by including a larger number of blue OLED devices, or blue OLED devices of larger sizes as compared with red or green OLED devices, while reducing the operating current densities of these blue OLED devices. The individual OLED devices of different types have substantially matched lifetimes in the resulting lighting system.

Wear Leveling

In the case of replacing some of the OLED devices for color tuning or to replace the burned devices, the newer OLED devices will have longer lifetime remaining as compared with older devices. That is, the different devices have different wearing levels, and the older devices or those devices that have been activated at higher levels have more wearing. Accordingly, a wear leveling method is provided to level out the wearing of different devices thereby expanding the lifetime of the lighting system.

For example, the OLED devices may be configured to be selectively activated to different levels. In one embodiment, at least some of the OLED devices are configured to be selectively turned on or off based on a lifetime of the at least some of the plurality of OLED devices. In particular, newer devices may be intentionally activated to higher activation levels. Activating to higher activation levels may include, for example, turning on the device for a longer period of time or at a higher frequency, or driving the device at a higher current density. On the other hand, those OLED devices of larger number, as discussed above, or of larger sizes, can be activated to lower activation levels to match their lifetimes with other OLED devices while maintaining the color coordinates of the lighting system.

In one example, as illustrated in FIG. 5 the blue OLED devices referenced as B1 and B2 may be alternately driven by a voltage pulse over time. Thus, each of the blue OLED devices is activated only half of the time as compared with the red or green OLED devices which would be running continuously. Accordingly, the effective lifetime of the system is maintained despite the different lifetimes of the components.

In some embodiments, the wearing of individual OLED devices is measured by a sensor. The sensor may be, for example, a local sensor for sensing a junction temperature or a current across the junction. Alternatively, the sensor may be a remote sensor for sensing the light output. The sensor provides means to detect those OLED devices having more wearing, and a feedback mechanism to compensate for the uneven wearing/aging. For example, an OLED device with more wearing, as indicated by either a measured parameter such as the current or the light output, or by the total time/cycles that the OLED device has been active, will be controlled to be activated at lower levels as compared with those OLEDs having less wearing.

In another embodiment, a feedback mechanism is included for driving the individual OLED devices to compensate for aging rather than for wear leveling. For example, individual OLED devices may be monitored for their current, output, junction temperature, or other properties, which are fed back into a control circuit to adjust the control voltage or current. For example, when it is detected that an OLED device has a drive current lower than normal, which likely results in lower light output, the drive voltage on that OLED device may be increased. If one of the OLED devices becomes defective and no longer produces light, a backup or redundant OLED device may be activated to replace the degraded OLED device.

Emission Spectrum

Figure 6:
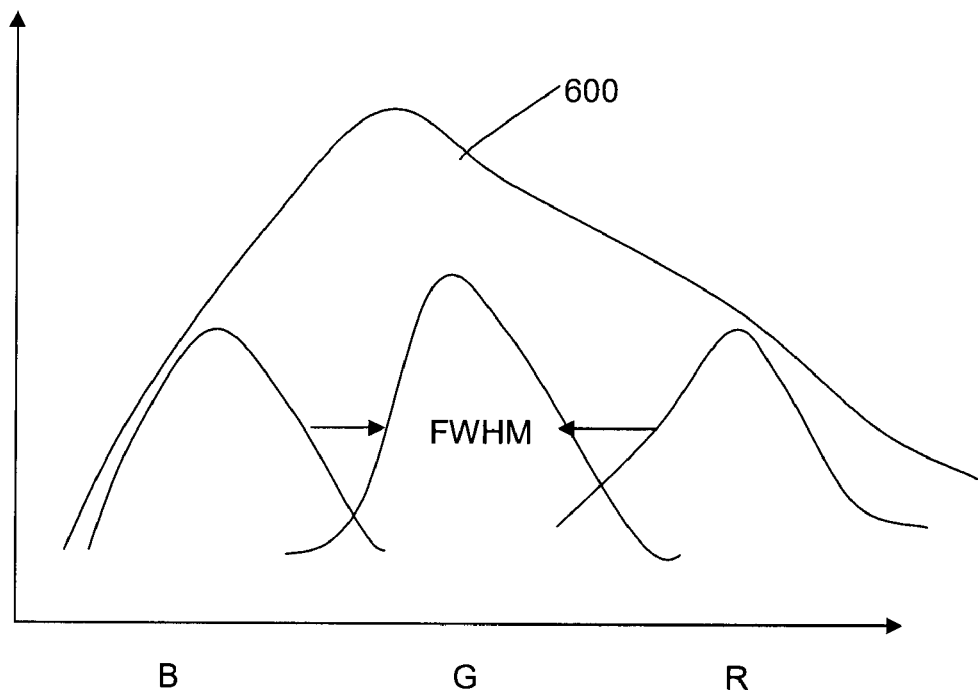
FIG. 6 illustrates example emission spectra of individual OLED devices and the mixed output spectrum.

The active region of the OLED device emits a relatively broad band spectrum. For example, as illustrated in FIG. 6, individual OLED devices may be configured to emit in the blue (B), green (G), red (R), white (W), or the like, regime.

The FWHM of the individual spectrum may be larger than 50 nm. Preferably the FWHM is larger than about 100 nm, and may be even larger than about 200 nm in some cases. The broadband emission spectrum may have a color selected from a white, a red, a green, a blue, a yellow, a orange, a cyan, or a magenta color. By appropriately mixing different OLED devices, the output spectrum 600 can be visually substantially white.

The broadband emission spectrum 600 corresponds to a color rendering index (CRI) higher than about 60, and preferably higher than about 80, or even higher than about 90. In one embodiment, the broadband emission spectrum corresponds to a CRI of about 100.

Advantageously, the broadband spectra of individual OLED devices are mixed to form the output spectrum 600 which may be very close to naturally white light to human eyes. This is in contrast to conventional lighting systems comprising inorganic LED devices, the spectra of which have a relatively narrow band, e.g., on the order of about 10 nm to 40 nm. The resulting mixed light may not be naturally white even when the CRI is high.

The active region of the OLED device may be substantially transparent. The anode may comprise a transparent conductor, for example, indium tin oxide (ITO). The cathode may comprise one of a metal or a metal alloy, such as aluminum-copper, or an organo-metallic material. In some embodiments, the cathode may also comprise a transparent conductor. When mostly transparent layers are used, a plurality of OLED devices may be vertically stacked without blocking light emission from individual devices. In addition, an OLED device may include a plurality of vertically-stacked transparent OLED chips, which are not stand-alone devices as they may not have their own encapsulations, but may have their own substrates and electrodes and can be individually controlled.

OLED Kit

The OLED structure illustrated in FIG. 1, as well as other basic OLED structures, can be applied to a modular design of OLED devices for lighting. In particular, a plurality of pre-manufactured modular OLED devices may be provided, and the individual modular OLED devices can be selected and "plugged" into a system mount, thereby forming a configurable lighting system. The system can have desired optical properties, such as the color, by selecting an appropriate subset of OLED devices from the kit to couple to the mount.

The pre-manufactured OLED devices such as that illustrated in FIG. 1 can be provided in a kit. The kit can include at least two types of pre-manufactured, modular OLED devices of different colors, each OLED device comprising a substrate, an anode, a cathode, and an active region comprising an organic material.

In addition to different colors, OLED devices with different sizes and different shapes may be provided. The active region may have a direct emission area that is very large, e.g., on the order of one meter or larger. The size may be limited by manufacturing processes. Preferably, the active region has a lateral dimension larger than about 0.5 centimeter. The active region preferably has an area larger than 25 mm$^2$. Various OLED shapes may include circular or polygonal shapes The OLED devices may already have couplers attached thereto, and thus can be "plug and play" devices.

The kit may further comprise a power supply, a mount for receiving at least some of the plurality of OLED devices, and a plurality of conductive couplers. The conductive couplers may be attached to the OLED devices already, or may be provided separately. Each of the plurality of conductive couplers has at least one conductive surface area and at least one insulating surface area at predetermined locations for electrically coupling one of the OLED devices with another OLED device, or with the mount. The kit may further comprise a homogenizer.

OLED Lighting Systems

Figure 7:
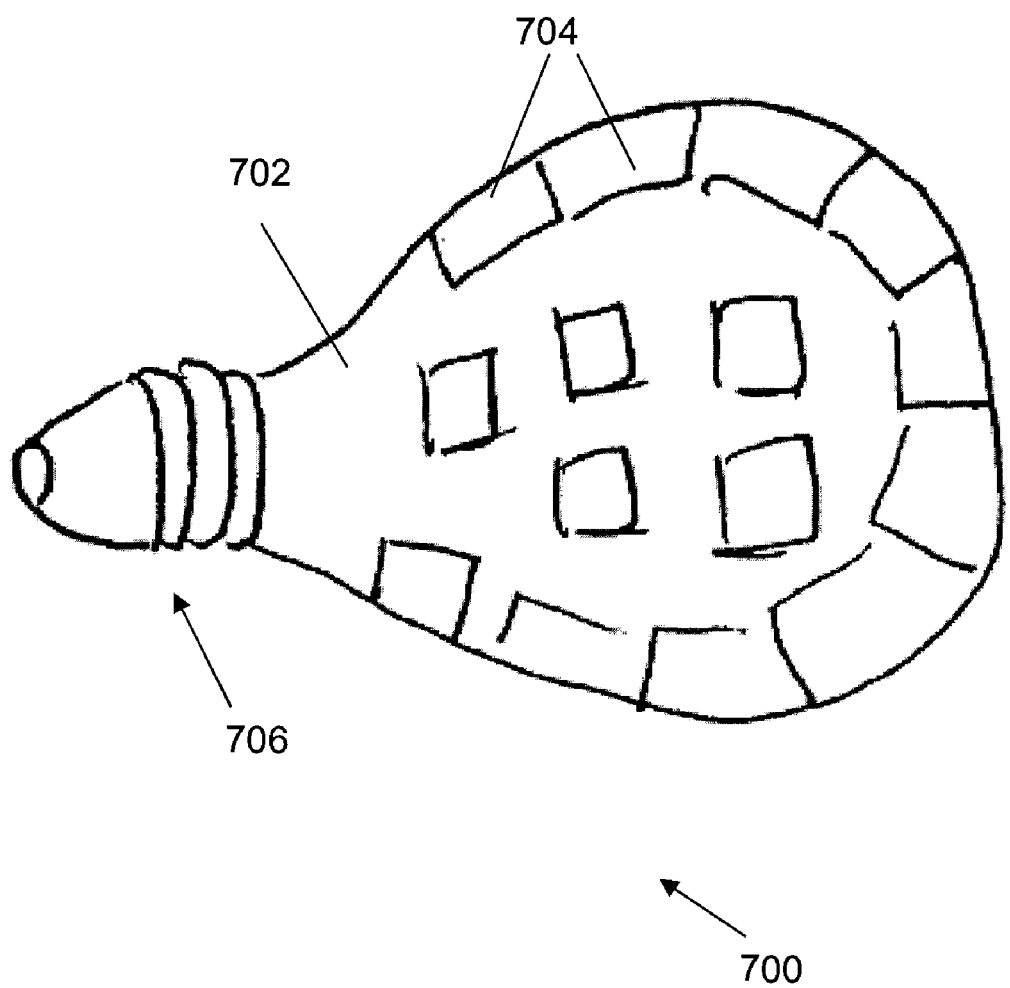
FIG. 7 is a schematic diagram illustrating a lighting system configured to replace a conventional light bulb.
Figure 8:
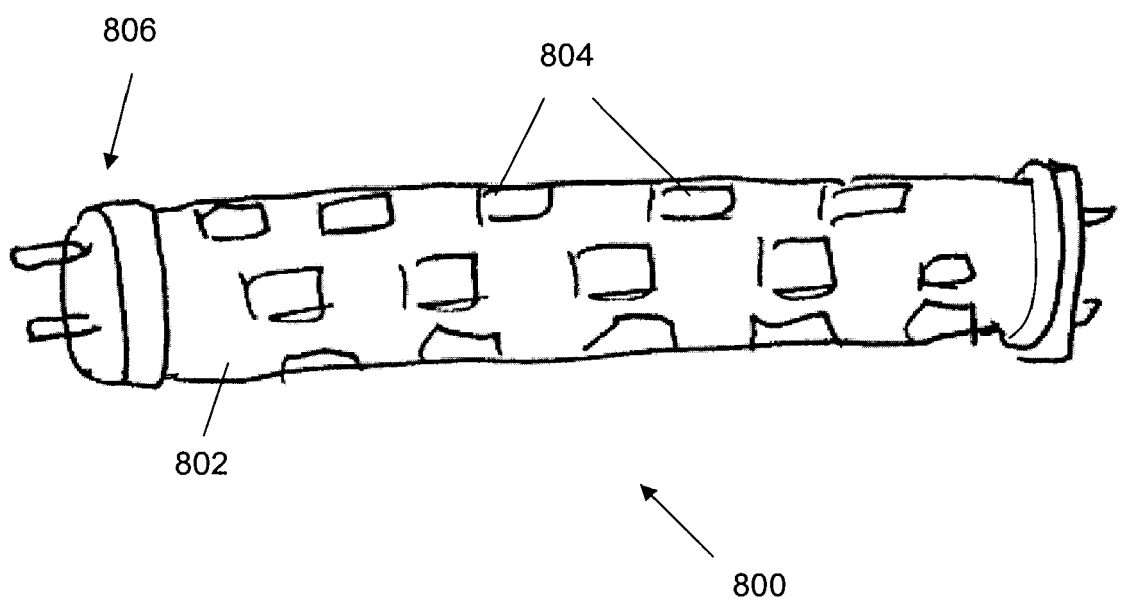
FIG. 8 is a schematic diagram illustrating a lighting system configured to replace a conventional tubular fluorescent lamp.

In FIGS. 7 and 8, it is illustrated that the individual OLED devices may be assembled to form lighting systems to replace conventional lighting systems such as a light bulb or a tubular fluorescent lamp.

In FIG. 7, an example lighting system 700 as shown comprises a mount 702, and a plurality of OLED devices 704 disposed on the mount 702. The mount may be shaped, for example, like a conventional light bulb. In one embodiment, the OLED devices 704 are mechanically coupled to the mount 702. In some other embodiments, the OLED devices 704 are also electrically coupled to the mount 704. The coupling may be realized using, for example, the couplers as illustrated in FIGS. 1-2D. In some embodiments, the OLED devices 704 may include the encapsulated, modular OLED devices such as that shown in FIG. 3, where the housing 304 of the OLED device can also serve as a coupler for the OLED device to be plugged into the mount. The OLED devices can be tightly arranged on a curved surface in example configurations as illustrated in FIGS. 4 and 5. Further, the lighting system 700 can further comprise a power adapter (not shown), which is generally known in the art, for providing appropriate drive voltage and current to the OLED devices 704.

The lighting system 700 can further comprise a plug portion 706, such as a threaded plug portion as shown in FIG. 7, which is configured to be mechanically and electrically coupled to a conventional light bulb receptor forming a luminaire. Thus, the lighting system 700 can readily replace an existing light bulb. The plug portion 706 may comprise metal or other conductive material. The OLED devices 704 can be electrically coupled to the plug portion 706 through the mount 702, or through electrical paths enclosed by the mount 702.

In FIG. 8, another example lighting system 800 as shown comprises a mount 802, and a plurality of OLED devices 804 disposed on the mount 802. As shown the mount 802 has a substantially tubular shape. The lighting system 802 can further comprise a plug portion 806, which is configured to be mechanically and electrically coupled to a conventional receptor for a tubular fluorescent lamp. Thus, the lighting system 800 can be assembled into a luminaire that can readily replace an existing tubular fluorescent lamp.

The luminance levels of OLED devices may improve such that the light output of lighting systems comprising light bulb-shaped and tubular fluorescent bulb-shaped mounts is comparable to that provided by conventional lighting systems. However, these lighting systems are also useful in applications where only low light levels are required and specific qualities of the light are desirable for the given application, such as a color characteristic.

In one embodiment, the plurality of OLED devices is white OLED devices. In some other embodiments, the plurality of OLED devices includes OLED devices of different colors, and the mixed light output from the lighting system can have desired color characteristics.

The lighting systems can be further coupled to controllers similar to that discussed above with respect to FIG. 1, and the controller can tune the color of light emitted by the light systems by driving the OLED devices individually to different activation levels.

The mounts 702 or 802 can be flexible, and the resulting lighting systems can thus have flexible shapes. Materials used to make flexible mounts are generally known in the art.

Coupling of OLED Devices into a Lighting System

Figure 9A:
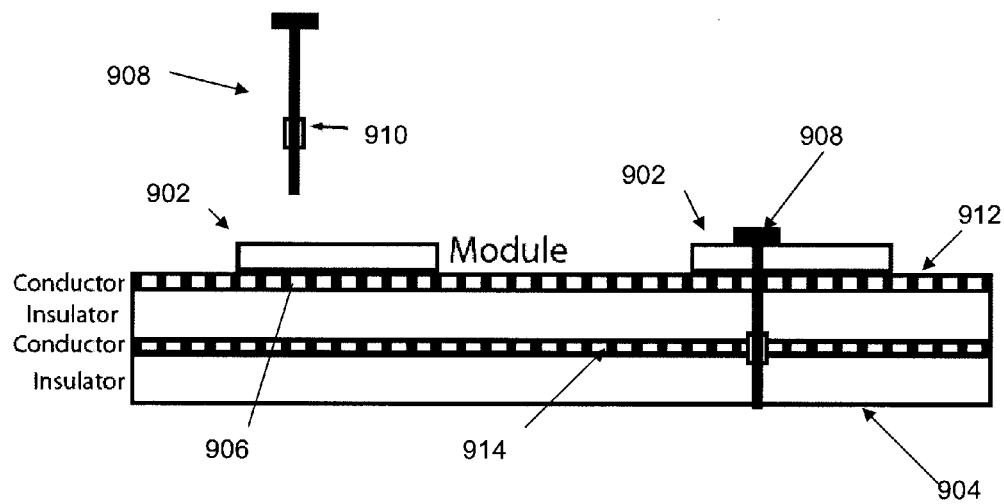
FIGS. 9A-9C are cross-sectional views of elongated conductors used for coupling OLED devices to form an OLED lighting system.

A method of coupling an OLED device with another OLED device, or with a mount to form a lighting system, is illustrated in FIG. 9A. The OLED device 902 and the mount 904 can have pre-fabricated openings 906, in which elongated conductors 908 may be fit in. The openings 906 may be etched or machined, depending on the substrate material of the OLED device 902 or the mount 904. Alternatively, openings 906 can be pierced by couplers 908 during the assembling process.

The elongated conductors 908 have patterned outer surface areas with insulating regions 910 and conductive regions at desired locations such that, when fitted into the openings 906, proper electrical paths and insulations among the vertical layers may be formed. The elongated conductors 908 may be snuggly fit into the openings 906, or by threaded engaging. The elongated conductor 908 may be flexible to accommodate a flexible system. The elongated conductor is configured to both mechanically and electrically couple one of the OLED devices 902 with another one of the OLED devices or with the mount 904.

In the mount 904 shown in FIG. 9A, two conductive layers 912 and 914 are included. More than two conductive layers may be incorporated into the mount. For instance, a first layer can serve as a common ground contact, and four additional layers may be included in the mount, each configured to drive a different type of OLED device. The different types of OLED devices can be red, green, blue, and white, for example. When the elongated conductor 908 is coupled to the mount 904 and the OLED device 902, the insulating region 910 comes into contact with the second conductive layer 914. Accordingly, an electrical connection is established between the first conductive layer 912 and the OLED device 902 through the elongated conductor 908. By prearranging the locations of the insulating regions and the conductive layers, complex electrical connections may be established.

Figure 9B:
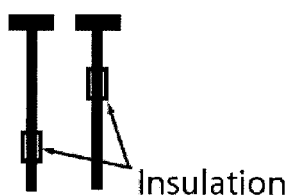
Figure 9B:
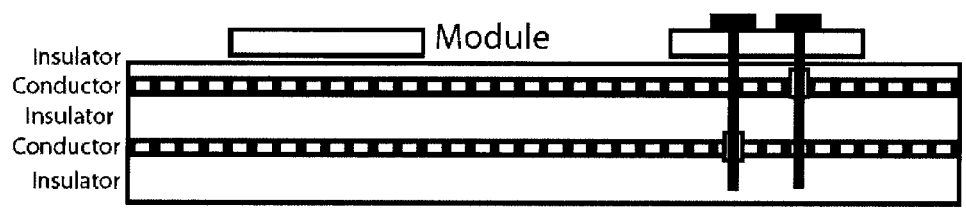

In another example shown in FIG. 9B, two elongated conductors are included each having insulating regions located at different locations. These locations may correspond to the depth of the two conductive layers. As shown, once both elongated conductors are coupled to the OLED device and the mount, two electrodes of the OLED device may be coupled to the first and second conductive layers, respectively.

Figure 9C:
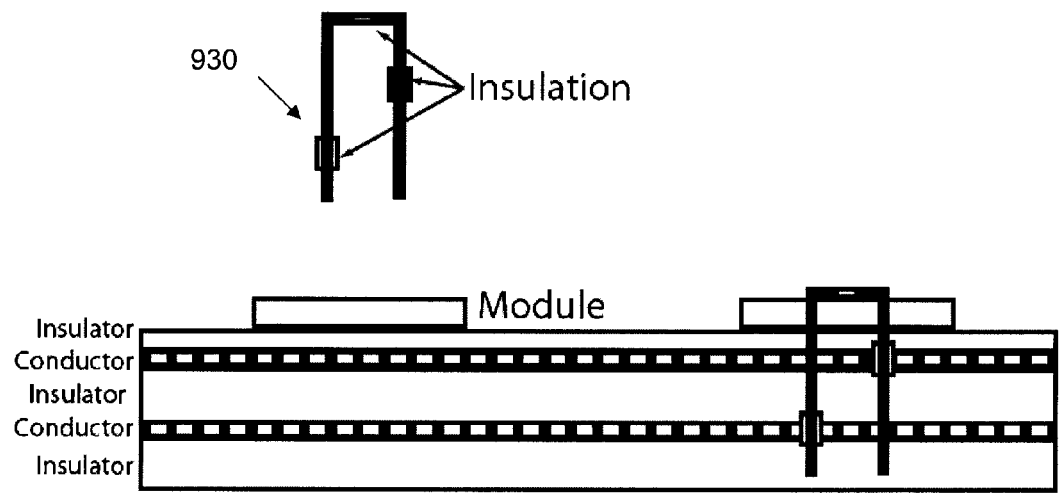

Further, in an embodiment shown in FIG. 9C, an integrated connector 930 may be used. The integrated connector 930 has a substantially "U" shape with two "arms" and resembles a staple. Insulating regions are disposed at different locations of the integrated connector 930. Those of ordinary skill in the art will recognize that connectors of other shapes with more "arms" are possible.

Figure 9D:
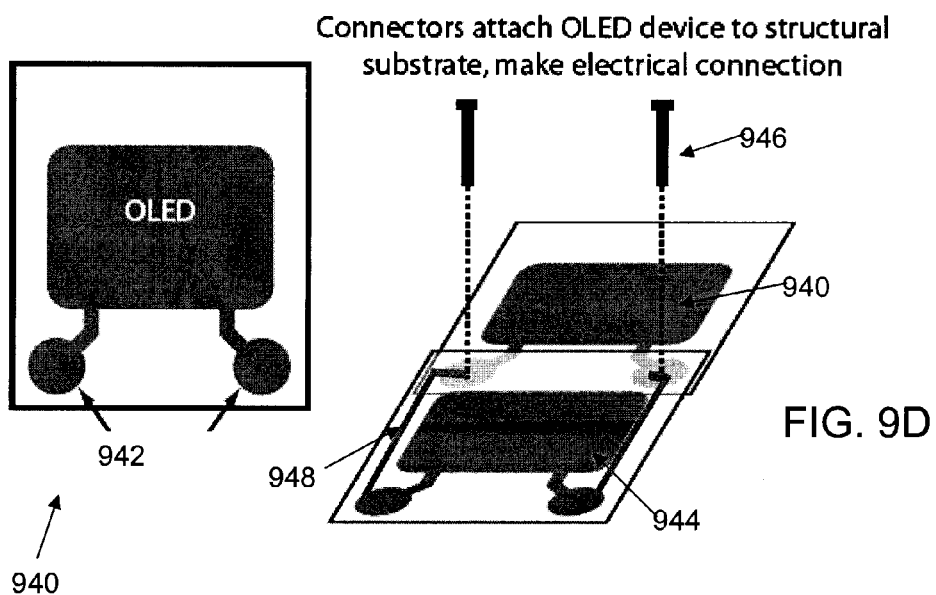
FIG. 9D is a schematic diagram illustrating OLED devices being coupled using elongated conductors.

As shown in FIG. 9D, an example OLED device 940 has one or more contact pads 942. The OLED device 940 can be coupled to a mount, or to another OLED device 944, using elongated conductors 946 that may be "stapled" through the contact pads 942. In one embodiment, a nail gun (not shown) can be used to drive he elongated conductors 946 to pierce through the contact pads 942 or the OLED device 940. As shown, the elongated conductors 946 can be electrically coupled to both OLED devices 940, 944 through their respective contact pads and the electrical paths 948. The electrical paths 948 can be printed on the OLED devices, or fabricated together with the electrodes and the active layers.

Figure 9E:
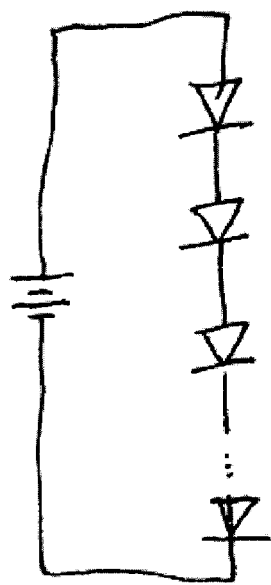
FIG. 9E is a simplified circuit diagram of a lighting system comprising a plurality of OLED devices connected in series.
Figure 9F:
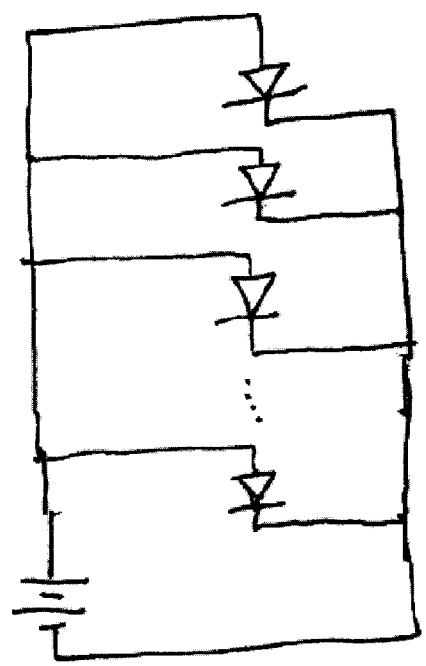
FIG. 9F is a simplified circuit diagram of a lighting system comprising a plurality of OLED devices connected in parallel.

Depending on the arrangements of the insulating regions and conductive regions of the connectors or elongated conductors, the individual OLED devices may be serially connected (FIG. 9E), or may be connected in parallel (FIG. 9F).

Configurable Lighting Systems

Using the methods of coupling such as those illustrated in FIGS. 9A-9D, the OLED devices such as those illustrated in FIGS. 3-5, and lighting systems such as shown in FIGS. 7 and 8, many different lighting systems can be built.

Figure 10:
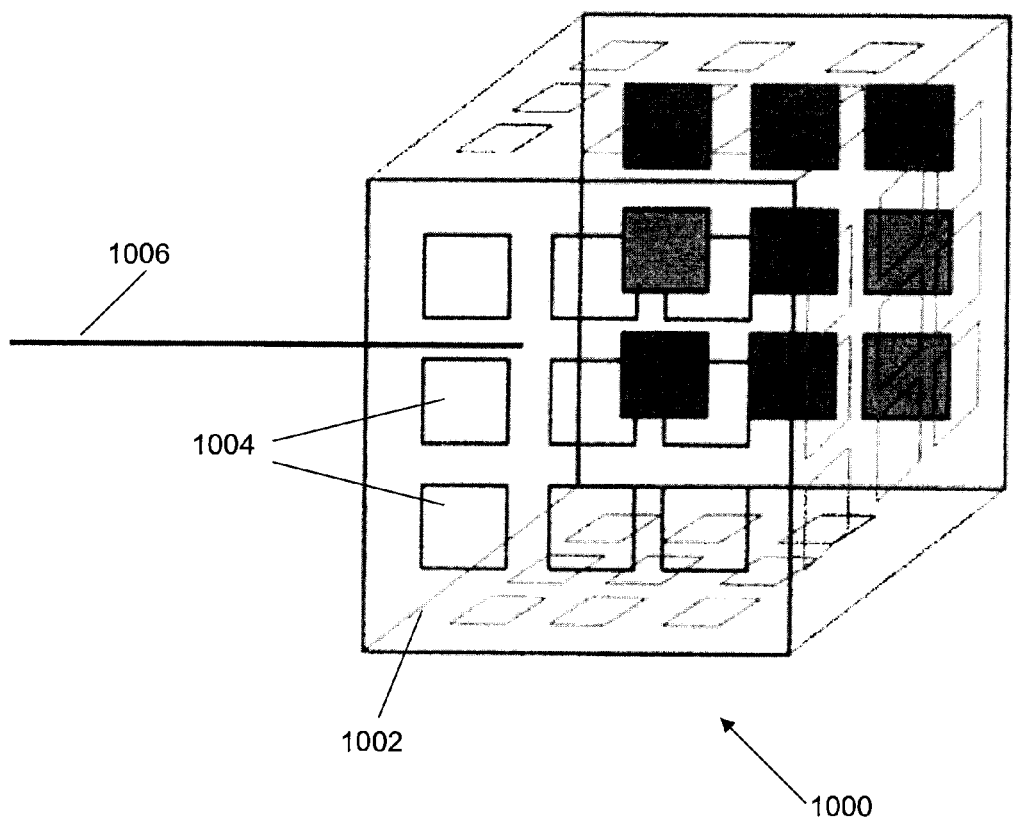
FIG. 10 is a perspective view of an example lighting system with a substantially cubic shape.

An example lighting system 1000 is illustrated FIG. 10. The lighting system 1000 has a substantially cube-shaped mount 1002, on which a plurality of OLED devices 1004 are disposed. In one embodiment, the mount 1002 is substantially transparent, and the OLED devices 1004 also have substantially transparent substrates, so that the OLED devices on all the sides of the light "cube" may be visible to a viewer. In some other embodiments, the mount 1002 can have selected sides to be non-transparent, e.g., translucent or opaque. Similarly, some of the OLED devices can selectively have non-transparent substrates. The resulting light "cube" would have angle-dependent visual effects. Rather than a cube-shaped mount, the lighting system may have the shape of another polyhedron, or a rounded shape.

The lighting system 1000 can further comprise an arm 1006 coupled to a face, edge, or corner of the mount 1002. The OLED devices 1004 can be coupled to an external power supply (not shown) through the arm 1006. The arm 1006 can also serve as a mechanical beam configured to cause the lighting system 1000 to move, such as to rotate about an axis along the arm 1006 or traverse a length of the arm. The lighting system 1000 can further comprise, or be coupled to, a controller (not shown) similar to that of FIG. 1, and the controller can control the OLED devices 1004 collectively or individually, to cause dynamic visual effects.

Figure 11:
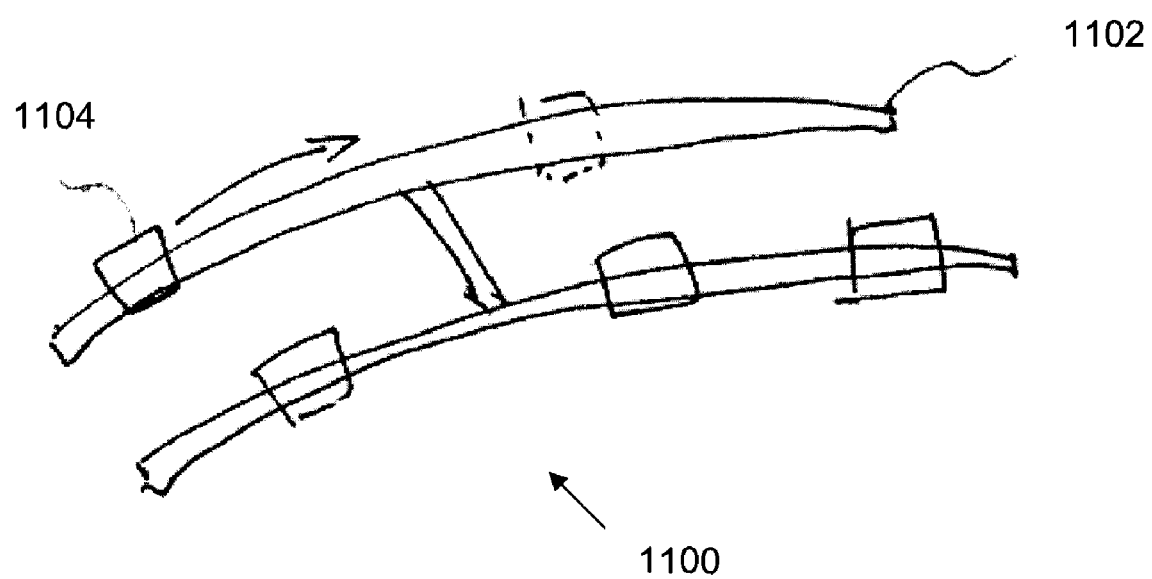
FIG. 11 is a schematic diagram illustrating rails used in lighting systems according to some embodiments.

In one embodiment, as illustrated in FIG. 11, a lighting system 1100 can comprise one or more rails 1102. The rails 1102 can be part of the mount. One or more OLED devices 1104 can be slidably coupled to the rails 1102. The rails 1102 can have predetermined shapes, or can be flexible. The OLED devices are thus disposed in a desired three-dimensional spatial distribution by selecting the predetermined shapes of the rails 1102, or by modifying the shapes of the flexible rails 1102. The OLED devices 1104 can further move about the rails 1102, thereby facilitating adjustment of the spatial distribution of the OLED devices and the resulting visual effects.

Figure 12:
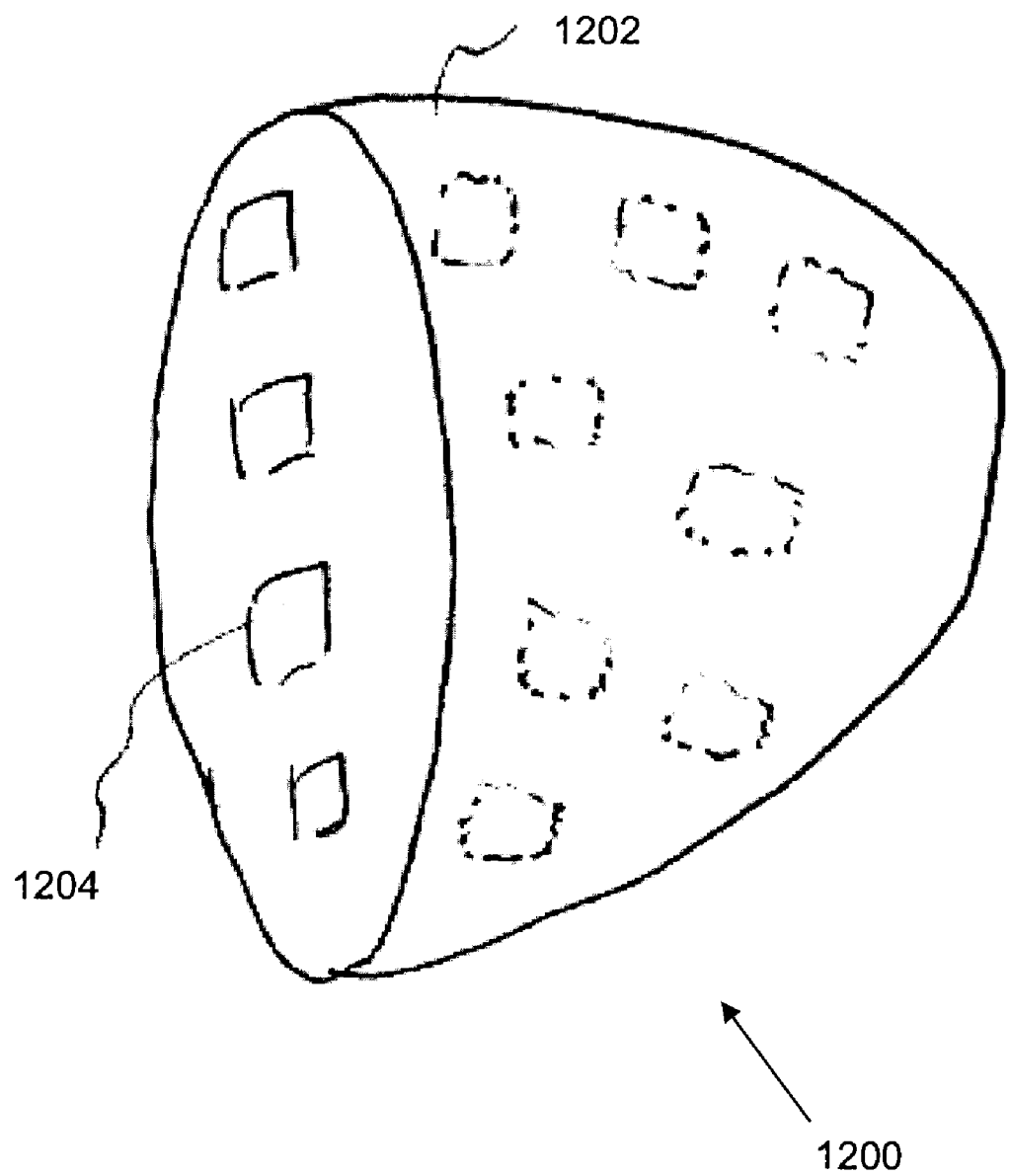
FIG. 12 is a schematic diagram of an example lighting system with a self-focusing light field.

In one embodiment, as illustrated in FIG. 12, a lighting system 1200 has a curved mount 1202, which can have, for example, a parabolic or a spherical curvature. A plurality of OLED devices 1204 can be disposed on the inner surface of the mount 1202. The light emission from the individual OLED devices may be directional. For example, when a non-transparent device substrate is used, the OLED device emits substantially in the direction opposite the substrate side. The light field from the individual OLED device can have a distribution with a predetermined shape depending on the device structure, the light out-coupling layer, and the active region.

The resulting light field from the combined emission from the plurality of OLED devices can have an intensity as a function of a distance to the mount 1204. For example, in one embodiment, the OLED devices are distributed such that the light from the individual OLED devices is concentrated in a predetermined region. As a result, the light intensity increases with the distance from the mount 1204 within a certain distance, thereby providing a self-focusing light field without the need for a reflector. The self-focusing light field can have a specified circular region of high color and illumination intensity uniformity. If the self-focusing region extends in one direction, an oblong lighted region of enhanced intensity can result.

This may result from, for example, the combination of directional emission of individual OLED devices and the spatial distribution of the OLED devices. The directional emission of the individual OLED devices can result from, for example, optical cavity effects, reflectivity of the substrate, and/or reflective cathodes. A large reflecting surface is not needed in this configuration to achieve a converging light field, although can be optionally included to further modify the combined light field from the individual OLEDs.

The OLED devices 1204 may be disposed on the inner surface of the mount 1202. Alternatively, if a substantially transparent mount 1202 is used, the OLED devices 1204 may be disposed on the outer surface of the substantially transparent mount 1202 while having their light emitting sides facing inwards. Alternatively, if the OLED devices 1204 have their light emitting sides facing outwards, various visual effects can be achieved although the light field may be no longer self focusing.

Similar to the lighting system 1000 shown in FIG. 10, a lighting system with curved surfaces, such as a spherical surface, or with polygonal surfaces, can be rotated or moved about an arm. In addition, the OLED devices can also be individually controlled to have visual effects such as flashing, blinking, or a sense of motion. Such lighting systems can be used, for example, in a dancing floor.

Figure 13:
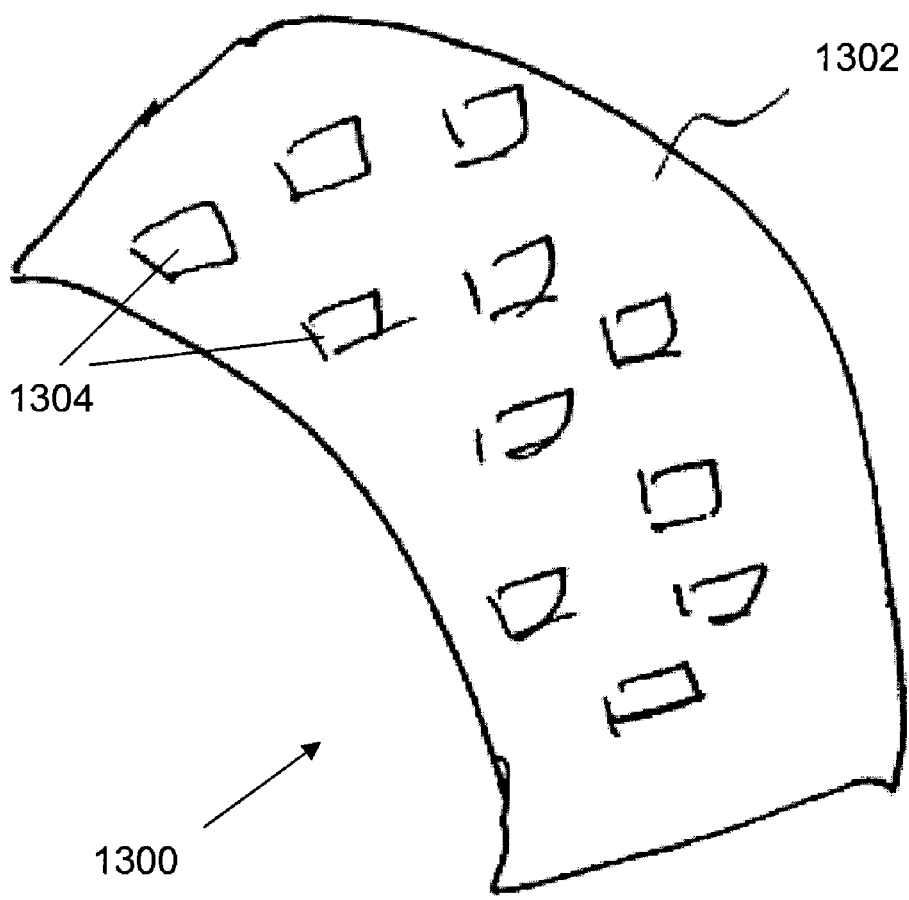
FIG. 13 is a schematic diagram of an example lighting system with a flexible mount.

A flexible lighting system 1300 is illustrated in FIG. 13, which comprises a flexible mount 1302, on which a plurality of OLED devices 1304 are disposed. The shape of the flexible mount 1302 can be easily changed, for example, by hand. The spatial distribution of the OLED devices 1302, and the resulting light field, can thus be adjusted. The mount 1302 can be coated to have a reflective surface to reflect and/or focus light emitted from the OLED devices 1304. The lighting system 1300 can also be particularly useful in imaging applications such as in photographic or cinematographic applications to properly illuminate the object to be photographed.

Figure 14:
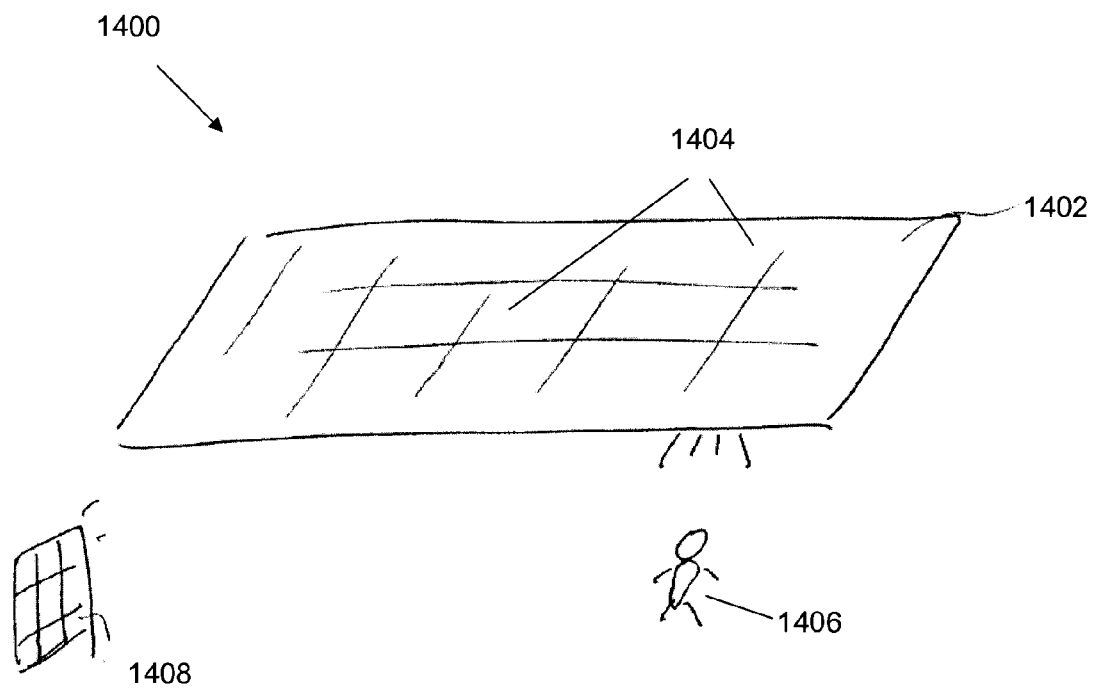
FIG. 14 is a schematic diagram of an example networked lighting system that can have a variable light field in response to a feedback.

In an adaptive lighting system 1400 as shown in FIG. 14, a plurality of OLED devices or panels 1404 may be arranged on a ceiling 1402 and side walls of a room, forming a lighting network throughout a building or a house. A feedback mechanism including a controller, similar to that illustrated in FIG. 1, is provided to individually control the OLED devices or panels 1404, to adjust the color characteristics and/or the intensity of output light.

A person 1406 moving about a room may be sensed by a sensor, and the detected location of the person 1406 is fed back to the OLED controller, such that the OLED devices 1404 may be selected to activate, or to activate at different activation levels, in response to the person's motion. This may be realized by, for example, assigning a logical address to each of the plurality of OLED device, wherein the address is correlated with the physical location of the OLED device, and selectively activating the OLED devices adjacent the person's locations using the controller to control the OLED devices by their logical addresses.

In addition, the OLED devices adjacent a window 1408 may be deactivated, or activated at a lower level, depending on the natural light level, and/or season, time, temperature, etc. The color in individual rooms may also be tuned manually or centrally controlled. The color of an individual room may be correlated to an external input, for example, the season.

The plurality of OLED devices can be coupled to each other or to a mount using the couplers as illustrated in FIGS. 2A-2D, or coupled to a mount (such as the ceiling) using the elongated conductors or connectors as illustrated in FIGS. 9A-9D. Alternatively, if the OLED devices have the configurations as illustrated in FIG. 3, the OLED devices may be directly plugged into indentations in the mount as illustrated in FIGS. 4 and 5.

Figure 15:
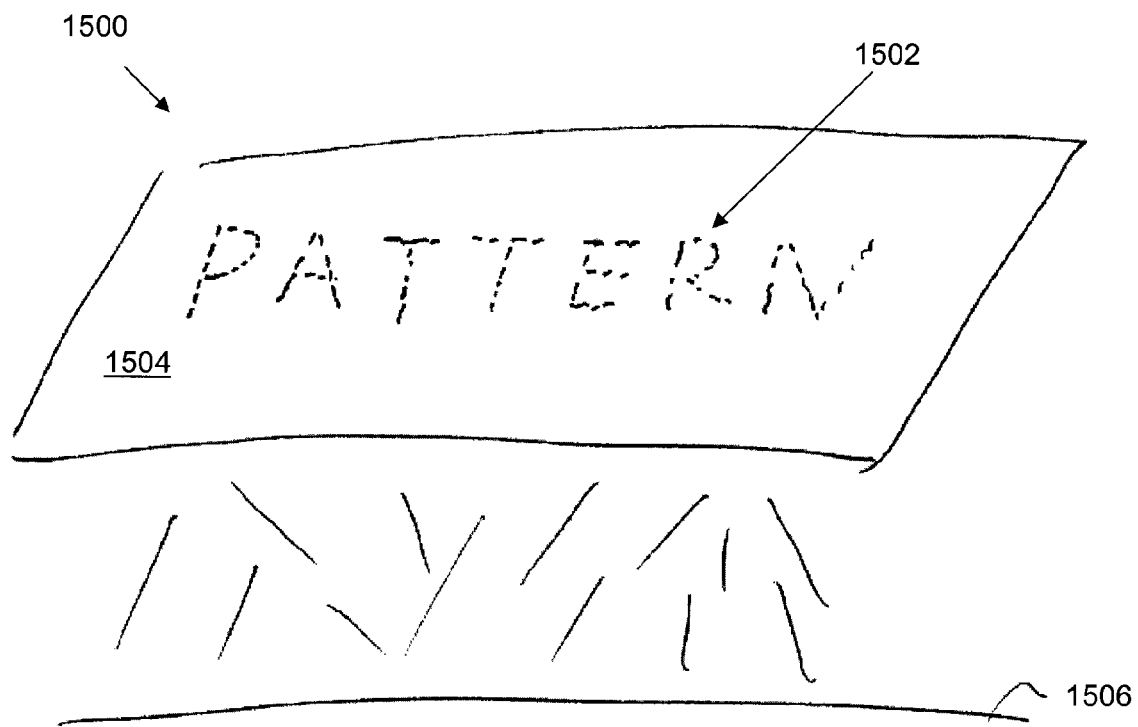
FIG. 15 is a schematic diagram of an example lighting system with a visually-discernible pattern.

In FIG. 15, a lighting system 1500 comprising a plurality of OLED devices is illustrated as having visually discernable patterns 1502, which may be distinguished from the background 1504, e.g., a ceiling, by colors, brightness, and shapes. The patterns may be configured such that the mixed light output at the ground level 1506 is still suitable for illumination purpose, e.g., the light field at the ground level 1506 is substantially uniform and can be substantially white. The pattern can comprise a logo, a character, and can be dynamically changing as controlled by a controller.

Figure 16:
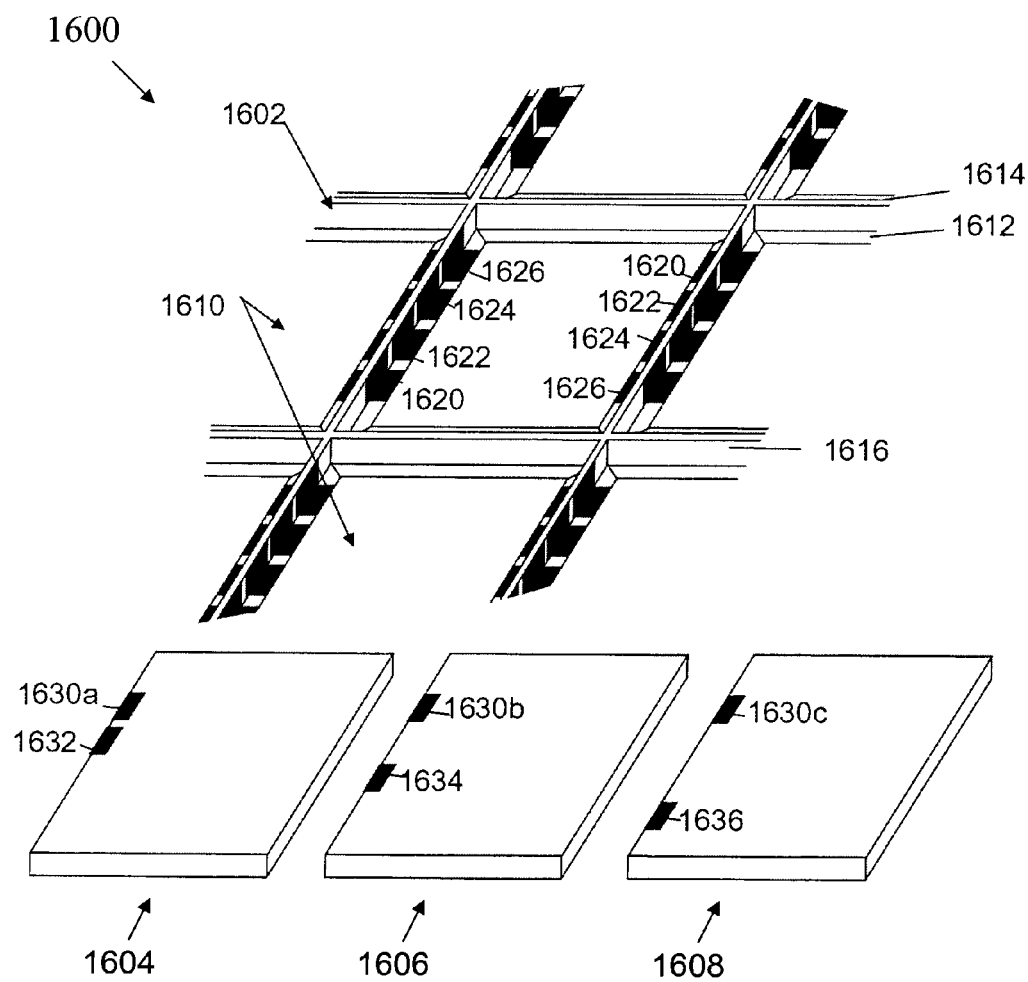
FIG. 16 is a schematic diagram of an example lighting system with a frame mount and a plurality of OLED devices of different colors configured to couple to the mount.

In FIG. 16, a lighting system 1600 comprising a mount 1602 and a plurality of OLED devices 1604, 1606, 1608 is illustrated. The mount 1602 comprises a frame configured to receive at least one OLED device. The frame also provides electrical coupling of the received OLED devices to the mount. The frame may comprise an array of receptacles 1610. The receptacles may have a front side 1612 and a back side 1614. The OLEDs may be loaded into the frame through the back side 1614. Alternatively, the OLEDs may be loaded through the front side 1612 similar to the way ceiling tiles are loaded into a drop ceiling frame. The frame may comprise vertical walls 1616 extending perpendicular to the closed side of the frame, resulting in a t-shaped cross section much like a ceiling tile support. These vertical walls may be used to aid in positioning the OLED devices within the frame such that they electrically connect with the mount.

The frame may comprise a plurality of conductive paths. As illustrated in FIG. 16, the conductive paths may be exposed at certain locations in the receptacle such that an electrical connection can be established between the conductive paths of the mount and the OLED device electrodes. In this embodiment, two contact regions in each receptacle serve as a connection to ground 1620, and the remaining conductive path contact regions, two each of 1622, 1624, 1626 provide various drive conditions. For instance, a first voltage, V1, a second voltage V2, and a third voltage V3 may be provided to the OLED devices by connection with a 1620 contact region and one of 1622, 1624, and 1626, respectively. The voltages V1, V2, and V3 may be the voltages desired to drive a red 1604, a green 1606, and a blue 1608 OLED device, respectively.

The lighting system may further comprise a controller to selectively vary the voltages V1, V2, and V3. For instance, the OLED devices may be made to flash, or the light output of the lighting system can be tuned to a warmer or cooler color temperature by varying the drive conditions of different color devices The OLED devices 1604, 1606, 1608 comprise electrodes 1630$a$, 1630$b$, 1630$c$, 1632, 1634, 1636, configured to electrically couple to conductive paths of the frame. Electrodes 1630$a$, 1630$b$, and 1630$c$ are configured to electrically connect with ground, 1620. Electrodes 1632, 1634, and 1636 are configured to couple with frame electrodes 1622, 1624, and 1626, respectively. The OLED devices 1604, 1606, and 1608 are coupled to the frame by loading them face down through the back side 1614 of the mount.

In FIG. 16, the receptacles 1610 and OLED devices 1605, 1606, 1608 are rectangular. The frame comprises two sets of electrodes such that the OLED device may be received by the frame in a first orientation, or rotated 180 degrees from the first orientation. This facilitates a user-configurable lighting system in that if the device fits into the receptacle, it is connected correctly.

The receptacles in the frame do not have to be rectangular. They may be of any polygonal, circular, or elliptical shape, for instance. The frame need not be space filling. Furthermore, the frame may be non-planar. The frame may be flexible. The frame may be configured to be mounted on a wall or ceiling. The frame may be configured to be free-standing.

The frame may comprise receptacles 1610 that are less than 25 cm$^2$ in area. OLED devices received by the mount may have an active region comprising a single light emitter. Alternatively, the OLED devices may have an active region comprising a plurality of light emitters, or light emitting regions within the area of the OLED device. The frame may comprise any desired number of receptacles. The desired number of receptacles may depend on a desired intensity, desired color characteristic, desired driving condition, desired coverage area, desired system lifetime, etc. A frame may also be designed to accommodate a plurality of OLED devices to form a specific pattern, logo, character, or figure.

The frame may comprise receptacles that are larger than 25 cm$^2$ in area, and even as large or larger than 1 m$^2$ in area. For example, the frame may be mounted to a ceiling, and OLED device panels may be received into the frame similar to the way in which ceiling tiles are positioned into a drop ceiling support. The OLED devices may be supported by the frame, and the weight of the panels may be sufficient to permit good electrical coupling between the frame electrodes and the OLED device electrodes. Other coupling members may also be employed to facilitate coupling such as spring loaded pins, screws, or magnets, for example.

Other coupling mechanisms that may mechanically or electrically or both mechanically and electrically couple the OLED devices to the mount include indentations or protrusions or other couplers shown in FIG. 2. In this embodiment, the frame may be connected to a power supply and conductive paths within the frame deliver power to the OLED devices. In some embodiments, only one drive condition is needed, so the complexity of the frame is reduced. For instance, all OLED devices may be of the same color such as white. The OLED devices may have single emitter active regions or active regions with a plurality of light emitters or light emitting regions within the area of the active region. When an active region comprises a plurality of light emitters, yield issues in fabrication of large area devices may be reduced. For instance, a short in one light emitter does not cause the failure of the rest of the plurality of light emitters within the OLED device.

The mount may comprise a backing. The backing may be used to protect the devices, aid in mechanical coupling of the devices to the frame by applying pressure, or the backing may be used as an attachment point for a support to make the lighting system free standing. The backing may be transparent. In these embodiments, the OLED devices may emit through the front side, the back side, or through both sides of the frame.

The mount may further comprise protective layers that lie within the receptacles of the frame. These protective layers may be transparent and my comprise glass or plastic, for instance.

Further Embodiments

In one embodiment, a lighting unit is provided. The lighting unit has a mount and a plurality of organic light emitting diode (OLED) devices disposed on the mount. The mount is configured to be removably coupled to a receptor both mechanically and electrically.

In another embodiment, a lighting unit is provided. The lighting unit has a mount and a plurality of OLED devices disposed on the mount. The mount is configured to be removably coupled to a receptor both mechanically and electrically and the receptor has a conventional threaded receptor for a light bulb.

In another embodiment, a lighting unit is provided. The lighting unit has a mount and a plurality of OLED devices disposed on the mount. The mount is configured to be removably coupled to a receptor both mechanically and electrically and the receptor comprises a socket for a conventional tubular fluorescent lamp.

In another embodiment, a lighting unit is provided. The lighting unit has a mount and a plurality of OLED devices disposed on the mount. The mount is configured to be removably coupled to a receptor both mechanically and electrically and has a shape of a conventional light bulb or a conventional tubular fluorescent lamp.

In another embodiment, a lighting unit is provided. The lighting unit has a mount and a plurality of OLED devices disposed on the mount. The mount is configured to be removably coupled to a receptor both mechanically and electrically and is flexible.

In another embodiment, a lighting unit is provided. The lighting unit has a mount and a plurality of OLED devices disposed on the mount. The mount is configured to be removably coupled to a receptor both mechanically and electrically and comprises a rail. At least one of the plurality of OLED devices is slidably coupled to the rail.

In another embodiment, a lighting unit is provided. The lighting unit has a mount and a plurality of OLED devices disposed on the mount. The mount is configured to be removably coupled to a receptor both mechanically and electrically. At least some of the OLED devices emits light of different spectra, and a mixed spectrum of the different spectra is substantially white.

In another embodiment, a lighting unit is provided. The lighting unit has a mount and a plurality of OLED devices disposed on the mount. The mount is configured to be removably coupled to a receptor both mechanically and electrically. At least some of the OLED devices are configured to be individually controlled by a controller to tune a color of light emitted by the lighting unit.

In another embodiment, a lighting unit is provided. The lighting unit has a mount and a plurality of OLED devices disposed on the mount. The mount is configured to be removably coupled to a receptor both mechanically and electrically. At least one of the OLED devices has a substrate, a cathode, an anode, an active region electrically coupled to the anode and the cathode, at least one coupler configured to electrically couple at least one of the anode or the cathode to a power supply, and an encapsulation that isolates the OLED device from an ambient environment.

In another embodiment, a lighting unit is provided. The lighting unit has a mount and a plurality of OLED devices disposed on the mount. The mount is configured to be removably coupled to a receptor both mechanically and electrically. At least one of the OLED devices comprises a substrate, a cathode, an anode, an active region electrically coupled to the anode and the cathode, wherein the active region is configured to emit a broadband emission with a FWHM larger than about 50 nm, at least one coupler configured to electrically couple at least one of the anode or the cathode to a power supply, and an encapsulation that isolates the OLED device from an ambient environment.

In one aspect, a lighting system is provided. The lighting system has a mount, a plurality of OLED devices disposed on the mount and electrically coupled to the mount, and a conventional receptor. The mount is configured to be removably coupled to the receptor both mechanically and electrically.

In another aspect, a lighting system is provided. The lighting system has a mount, a plurality of OLED devices disposed on the mount and electrically coupled to the mount, a conventional receptor, and a power supply. The mount is configured to be removably coupled to the receptor both mechanically and electrically and the OLED devices are configured to be electrically coupled to the power supply through the mount.

In another aspect, a lighting system is provided. The lighting system has a mount, a plurality of OLED devices disposed on the mount and electrically coupled to the mount, and a conventional receptor. The mount is configured to be removably coupled to the receptor both mechanically and electrically. The receptor comprises a conventional threaded receptor for a light bulb or an adaptor for a conventional fluorescent lamp.

In another aspect, a lighting system is provided. The lighting system has a mount, a plurality of OLED devices disposed on the mount and electrically coupled to the mount, a conventional receptor, and a controller configured to tune a color of light emitted by the lighting system. The mount is configured to be removably coupled to the receptor both mechanically and electrically.

In another aspect, a lighting system is provided. The lighting system has a mount, a plurality of OLED devices disposed on the mount and electrically coupled to the mount, a conventional receptor, a controller configured to control activation levels of one or more of the OLED devices, and a sensor configured to provide feedback to the controller. The mount is configured to be removably coupled to the receptor both mechanically and electrically.

In another aspect, a lighting system is provided. The lighting system has a mount, a plurality of OLED devices disposed on the mount and electrically coupled to the mount, a conventional receptor, a sensor for sensing a degradation of one or more OLED devices, and a controller configured to drive one or more of the plurality of OLED devices to different activation levels to compensate for the sensed degradation. The mount is configured to be removably coupled to the receptor both mechanically and electrically.

In another aspect, a lighting system is provided. The lighting system has a mount, a plurality of OLED devices disposed on the mount and electrically coupled to the mount, a conventional receptor, and a sensor for sensing a degradation of one or more OLED devices. The mount is configured to be removably coupled to the receptor both mechanically and electrically and the controller is configured to increase a drive voltage or current of the OLED devices to compensate for the sensed degradation.

In another aspect, a lighting system is provided. The lighting system has a mount, a plurality of OLED devices disposed on the mount and electrically coupled to the mount, a conventional receptor, and a sensor for sensing a degradation of one or more OLED devices wherein at least some of the OLED devices are redundant OLED devices. The mount is configured to be removably coupled to the receptor both mechanically and electrically and the controller is configured to turn on one or more of the redundant OLED devices to compensate for the sensed degradation.

In another aspect, a lighting system is provided. The lighting system has a mount, a plurality of OLED devices disposed on the mount and electrically coupled to the mount, a conventional receptor, and a sensor for sensing a degradation of one or more OLED devices. The mount is configured to be removably coupled to the receptor both mechanically and electrically and the sensor is configured to sense one of a temperature, a current, a capacitance, or a luminance of the OLED devices.

In one embodiment, a lighting system is provided. The lighting system has a plurality of OLED devices arranged in a spatial distribution such that a light output from the lighting system converges in a predetermined region.

In another embodiment, a lighting system is provided. The lighting system has a plurality of OLED devices arranged in a spatial distribution such that a light output from the lighting system converges in a predetermined region. The lighting system also has a mount which has a substantially parabolic, spherical, or oval shaped surface. The OLED devices are coupled to the mount both electrically and mechanically, and wherein the OLED devices are arranged on the surface such that a light output from the lighting system is converges in a predetermined region.

In another embodiment, a lighting system is provided. The lighting system has a plurality of OLED devices arranged in a spatial distribution such that a light output from the lighting system converges in a predetermined region without a reflector.

In another embodiment, a lighting system is provided. The lighting system has a plurality of OLED devices arranged in a spatial distribution such that a light output from the lighting system converges in a predetermined region.

In another embodiment, a lighting system is provided. The lighting system has a plurality of OLED devices arranged in a spatial distribution such that a light output from the lighting system converges in a predetermined region. The lighting system also has a mount which as a substantially parabolic, spherical, or oval shaped surface. The OLED devices are disposed on the surface. At least some of the OLED devices have light emitting sides which face inwards from the surface thereby causing the converging light output.

In another embodiment, a lighting system is provided. The lighting system has a plurality of OLED devices arranged in a spatial distribution such that a light output from the lighting system converges in a predetermined region. The lighting system also has a flexible mount to which the OLED devices are coupled both electrically and mechanically. The spatial distribution of the OLED devices is variable by varying a shape of the flexible mount.

In another embodiment, a lighting system is provided. The lighting system has a plurality of OLED devices arranged in a spatial distribution such that a light output from the lighting system converges in a predetermined region. The lighting system also has a mount, which has at least one rail. Some of the OLED devices are slidably coupled to the rail.

In another embodiment, a lighting system is provided. The lighting system has a plurality of OLED devices arranged in a spatial distribution such that a light output from the lighting system converges in a predetermined region. The OLED devices are arranged in a cubic, spherical, or parabolic spatial distribution.

In another embodiment, a lighting system is provided. The lighting system has a plurality of OLED devices arranged in a spatial distribution such that a light output from the lighting system converges in a predetermined region. The lighting system also has a reflective surface configured to modify the light output.

In one aspect, a lighting system is provided. The lighting system has a plurality of OLED devices forming visually-discernible patterns, and a mixed light output from the OLED devices is suitable for illumination.

In another aspect, a lighting system is provided. The lighting system has a plurality of OLED devices forming visually-discernible patterns comprising at a logo, character, or dynamic pattern. A mixed light output from the OLED devices is suitable for illumination.

In another aspect, a lighting system is provided. The lighting system has a plurality of OLED devices forming visually-discernible patterns. A mixed light output from the OLED devices is suitable for illumination and is substantially uniform adjacent a ground level.

In another aspect, a lighting system is provided. The lighting system has a plurality of OLED devices forming visually-discernible patterns. The mixed light output from the OLED devices is suitable for illumination and is substantially uniform and has a substantially white color adjacent a ground level.

In one embodiment, a luminaire is provided. The luminaire has a substantially cube shaped mount and OLED devices disposed on some surfaces of the mount.

In another embodiment, a luminaire is provided. The luminaire has a substantially cube shaped mount and OLED devices disposed on some surfaces of the mount. The mount is substantially transparent to some of the light emitted from the OLED devices.

In another embodiment, a luminaire is provided. The luminaire has a substantially cube shaped mount and OLED devices disposed on some surfaces of the mount. The mount has a rail to which at least one of the OLED devices is slidably coupled.

In another embodiment, a luminaire is provided. The luminaire has a substantially cube shaped mount and OLED devices disposed on some surfaces of the mount. The luminaire also has an arm coupled to the mount, and the mount is configured to rotate about an axis along the arm.

In another embodiment, a luminaire is provided. The luminaire has a substantially cube shaped mount and OLED devices disposed on some surfaces of the mount.

The luminaire also has an arm coupled to the mount, and the mount is configured to rotate about an axis along the arm. The OLED devices are coupled to an external power supply through the arm.

In another embodiment, a luminaire is provided. The luminaire has a substantially cube shaped mount and OLED devices disposed on some surfaces of the mount. At least some of the OLED devices are vertically stacked.

In one aspect, a lighting system for an imaging application is provided. The lighting system has a flexible mount. OLED devices are disposed on the flexible mount such that the light output intensity from the lighting system varies as a function of distance from the lighting system.

In another aspect, a lighting system for an imaging application is provided. The lighting system has a flexible mount and at least one rail. OLED devices are disposed on the flexible mount such that the light output intensity from the lighting system varies as a function of distance from the lighting system. At least one of the OLED devices is slidably coupled to the rail.

In another aspect, a lighting system for an imaging application is provided. The lighting system has a flexible mount configured to change shape by hand. OLED devices are disposed on the flexible mount such that the light output intensity from the lighting system varies as a function of distance from the lighting system.

In another aspect, a lighting system for an imaging application is provided. The lighting system has a flexible mount. OLED devices are disposed on the flexible mount such that the light output intensity from the lighting system varies as a function of distance from the lighting system.

In another aspect, a lighting system for an imaging application is provided. The lighting system has a flexible mount with a reflective surface. OLED devices are disposed on the flexible mount such that the light output intensity from the lighting system varies as a function of distance from the lighting system.

In one embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. The OLED devices are configured to be selectively activated to different activation levels thereby generating a light field with a varying color, brightness, or spatial distribution.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. At least some of the OLED devices are modular, replaceable devices.

In another embodiment, a lighting system is provided. The lighting system has a plurality of OLED devices arranged in a spatial distribution and a mount to which the OLED devices are coupled. The OLED devices are configured to be selectively activated based on an input which is one or more of an ambient light, a person's position, an ambient temperature, a user input, season, or time.

In another embodiment, a lighting system is provided. The lighting system has a mount and a plurality of OLED devices arranged in a spatial distribution. The OLED devices are mechanically and electrically coupled to the mount. The OLED devices are configured to be selectively activated based on an input which is one or more of an ambient light, a person's position, an ambient temperature, a user input, season, or time.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. The lighting system also has a mount with indentations. At least one of the OLED devices has a housing, and is mechanically and electrically coupled to the mount by inserting the housing into the indentations.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. The lighting system also has a mount with one or more conductive layers. The OLED devices are coupled to the mount with elongated conductors having patterned conductive and insulating areas corresponding to locations of the conductive layers.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. At least some of the OLED devices are coupled to each other through couplers.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. At least some of the OLED devices are mechanically and electrically coupled to each other through couplers.

In another embodiment, a lighting system is provided. The lighting system has a plurality of OLED devices arranged in a spatial distribution. The OLED devices are configured to be selectively activated based on an input which is one or more of an ambient light, a person's position, an ambient temperature, a user input, season, or time. At least some of the OLED devices are mechanically and electrically coupled to each other through couplers comprising metal inserts configured to form electrical contacts.

In one aspect, a method of providing a configurable light field is provided. The method involves arranging OLED devices in a spatial distribution such that a light output intensity from the lighting system varies as a function of a distance from the plurality of OLED devices, and varying at least one of the spatial distribution or an orientation of the plurality of OLED devices.

In another aspect, a method of providing a configurable light field is provided. The method involves arranging OLED devices in a spatial distribution such that a light output intensity from the lighting system varies as a function of a distance from the plurality of OLED devices, and varying at least one of the spatial distribution or an orientation of the plurality of OLED devices. Arranging the OLED devices in a spatial distribution comprises coupling at least some of the OLED devices to each other.

In another aspect, a method of providing a configurable light field is provided. The method involves arranging OLED devices in a spatial distribution such that a light output intensity from the lighting system varies as a function of a distance from the plurality of OLED devices, and varying at least one of the spatial distribution or an orientation of the plurality of OLED devices. Arranging the OLED devices in a spatial distribution comprises coupling mechanically and electrically at least some of the OLED devices to each other to form a mosaic.

In another aspect, a method of providing a configurable light field is provided. The method involves arranging OLED devices in a spatial distribution such that a light output intensity from the lighting system varies as a function of a distance from the plurality of OLED devices, and varying at least one of the spatial distribution or an orientation of the plurality of OLED devices. Arranging the OLED devices in a spatial distribution comprises coupling some of the OLED devices to each other to form a mosaic, and wherein varying at least one of the spatial distribution or an orientation of the OLED devices comprises replacing at least some of the OLED devices.

In another aspect, a method of providing a configurable light field is provided. The method involves arranging OLED devices in a spatial distribution such that light output intensity from the lighting system varies as a function of a distance from the OLED devices, and varying at least one of the spatial distribution or an orientation of the OLED devices. Arranging the OLED devices in a spatial distribution comprises coupling some of the OLED devices to a mount.

In another aspect, a method of providing a configurable light field is provided. The method involves arranging OLED devices in a spatial distribution such that a light output intensity from the lighting system varies as a function of a distance from the OLED devices, and varying at least one of the spatial distribution or an orientation of the OLED devices.

Arranging the OLED devices in a spatial distribution comprises coupling some of the OLED devices to a flexible mount, and varying the spatial distribution or an orientation of the OLED devices comprises changing the shape of the flexible mount.

In one embodiment, a method is provided. The method involves arranging a plurality of OLED devices in a spatial distribution and selectively activating the OLED devices to different activation levels based on a feedback to generate a variable light field. The feedback comprises one or more of an ambient light, a person's position, an ambient temperature, a user input, season, or time.

In another embodiment, a method is provided. The method involves arranging OLED devices in a spatial distribution and selectively activating the OLED devices to different activation levels based on a feedback to generate a variable light field. The feedback comprises one or more of an ambient light, a person's position, an ambient temperature, a user input, season, or time. Arranging OLED devices in a spatial distribution comprises coupling the plurality of OLED devices to a mount.

In another embodiment, a method is provided. The method involves arranging OLED devices in a spatial distribution and selectively activating the OLED devices to different activation levels based on a feedback to generate a variable light field. The feedback comprises one or more of an ambient light, a person's position, an ambient temperature, a user input, season, or time. Arranging OLED devices in a spatial distribution comprises coupling mechanically and electrically the plurality of OLED devices to a mount.

In another embodiment, a method is provided. The method involves arranging OLED devices in a spatial distribution and selectively activating the OLED devices to different activation levels based on a feedback to generate a variable light field. The feedback comprises one or more of an ambient light, a person's position, an ambient temperature, a user input, season, or time. Arranging OLED devices in a spatial distribution comprises coupling some of the OLED devices to each other thereby forming a mosaic.

In another embodiment, a method is provided. The method involves arranging OLED devices in a spatial distribution and selectively activating the OLED devices to different activation levels based on a feedback to generate a variable light field. The feedback comprises one or more of an ambient light, a person's position, an ambient temperature, a user input, season, or time. Arranging OLED devices in a spatial distribution comprises coupling mechanically and electrically at least some of the OLED devices to each other thereby forming a mosaic.

The embodiments shown in FIGS. 1-16 are exemplary. Other embodiments can be prepared within the spirit and scope of the claims by one skilled in the art.

What is claimed is:

1. A lighting system comprising:
   a plurality of planar organic light emitting diode (OLED) devices, each of the OLED devices comprising a ground electrode, and an additional electrode; and
   a mount comprising a frame for a ceiling light fixture or a wall light fixture, the frame comprising a plurality of receptacles, each of the receptacles being configured to receive at least one of the OLED devices so as to provide an electrical connection between the mount and the at least one of the OLED devices,
   wherein each of the receptacles comprises a ground conductive path contact region, and a plurality of additional conductive path contact regions including at least a first additional conductive path contact region and a second additional conductive path contact region for driving different colored OLED devices based on voltage, and
   wherein the first additional conductive path contact region is configured to provide a first voltage, and the second additional conductive path contact region is configured to provide a second voltage that is different from the first voltage.

2. The lighting system of claim 1, wherein the mount is configured to be removably coupled to a receptor both mechanically and electrically.

3. The lighting system of claim 1, wherein at least some of the plurality of OLED devices disposed on the mount are configured to be coupled to the mount both mechanically and electrically.

4. The lighting system of claim 1, wherein at least some of the plurality of OLED devices emit light of different spectra, and wherein a mixed light output of the lighting system is substantially white.

5. The lighting system of claim 1, wherein at least some of the plurality of OLED devices are configured to be individually controlled by a controller to tune a color, an intensity, or a spatial distribution of light emitted by the lighting system.

6. The lighting system of claim 1, further comprising at least one coupler configured to couple the at least one of the OLED devices to the mount electrically, mechanically, or both electrically and mechanically.

7. The lighting system of claim 1, further comprising a power supply, wherein the OLED devices are configured to be electrically coupled to the power supply through the mount.

8. The lighting system of claim 1, further comprising:
   a controller configured to control activation levels of one or more of the plurality of OLED devices; and
   a sensor configured to provide a feedback to the controller.

9. The lighting system of claim 1, wherein the frame further comprises a backing.

10. The lighting system of claim 1, wherein the at least some of the plurality of OLED devices are configured to be removably received by the frame.

11. The lighting system of claim 1, wherein the at least one of the OLED devices comprises an active region with a plurality of light emitters.

12. The lighting system of claim 1, wherein the electrical connection between the mount and the at least one of the OLED devices is made by indentations or protrusions in the mount coupled to complementary indentations or protrusions in the OLED device.

13. The lighting system of claim 1, further comprising a controller configured to control drive conditions supplied by the plurality of additional conductive path contact regions.

14. The lighting system of claim 1, wherein the frame is flexible.

15. The lighting system of claim 1, wherein the at least one of the OLED devices is coupled to the frame via a magnetic coupling member.

* * * * *